United States Patent
Camp et al.

(10) Patent No.: US 10,162,700 B2
(45) Date of Patent: Dec. 25, 2018

(54) WORKLOAD-ADAPTIVE DATA PACKING ALGORITHM

(71) Applicant: International Business Machines Corporation, Armonk, NY (US)

(72) Inventors: Charles J. Camp, Sugar Land, TX (US); Thomas Mittelholzer, Zurich (CH); Nikolaos Papandreou, Thalwil (CH); Thomas Parnell, Zurich (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 520 days.

(21) Appl. No.: 14/581,954

(22) Filed: Dec. 23, 2014

(65) Prior Publication Data
US 2016/0179614 A1 Jun. 23, 2016

(51) Int. Cl.
*G11C 29/52* (2006.01)
*G06F 11/10* (2006.01)
(Continued)

(52) U.S. Cl.
CPC ..... *G06F 11/1012* (2013.01); *H03M 13/6312* (2013.01); *H03M 13/6318* (2013.01);
(Continued)

(58) Field of Classification Search
CPC ......... G06F 2212/401; G06F 2212/403; G06F 2212/657; G06F 2212/7201; G06F 11/1008; G06F 11/1068; G06F 12/0238; G06F 12/0246; G11C 29/52; H03M 13/618; H03M 13/6312; H03M 13/6318
See application file for complete search history.

(56) References Cited

U.S. PATENT DOCUMENTS

| 5,386,531 A | 1/1995 | Blaner et al. |
| 6,105,109 A | 8/2000 | Krumm et al. |

(Continued)

FOREIGN PATENT DOCUMENTS

| CN | 101958720 B | 3/2013 |
| CN | 103200467 A | 7/2013 |

(Continued)

OTHER PUBLICATIONS

Non-Final Office Action from U.S. Appl. No. 14/536,550, dated Jul. 1, 2016.
(Continued)

*Primary Examiner* — Kyle Vallecillo
*Assistant Examiner* — Christian M Dorman
(74) *Attorney, Agent, or Firm* — Zilka-Kotab, P.C.

(57) ABSTRACT

A method, according to one embodiment, includes selecting, from a buffer, a combination of compressed logical pages of data to maximize an amount of used space in an error correction code container. The method also preferably includes processing the combination of compressed logical pages to generate error correction code data. Furthermore, the method may include writing the data corresponding to the combination of compressed logical pages and the associated error correction code data to a non-volatile random access memory. Other systems, methods, and computer program products are described in additional embodiments.

23 Claims, 16 Drawing Sheets

(51) Int. Cl.
*H03M 13/00* (2006.01)
*G06F 12/02* (2006.01)
*H03M 13/13* (2006.01)
*H03M 13/15* (2006.01)
*G11C 29/04* (2006.01)

(52) U.S. Cl.
CPC ...... *G06F 11/1068* (2013.01); *G06F 12/0238* (2013.01); *G06F 12/0246* (2013.01); *G06F 2212/401* (2013.01); *G06F 2212/657* (2013.01); *G11C 29/52* (2013.01); *G11C 2029/0411* (2013.01); *H03M 13/13* (2013.01); *H03M 13/152* (2013.01)

(56) References Cited

U.S. PATENT DOCUMENTS

| | | | |
|---|---|---|---|
| 6,128,623 | A | 10/2000 | Mattis et al. |
| 6,467,021 | B1 | 10/2002 | Sinclair |
| 6,857,087 | B2 | 2/2005 | Crozier et al. |
| 7,437,492 | B2 | 10/2008 | Stager et al. |
| 7,904,640 | B2 | 3/2011 | Yano et al. |
| 8,176,381 | B2 | 5/2012 | Djordjevic et al. |
| 8,533,550 | B2 | 9/2013 | Khan |
| 8,560,926 | B2 | 10/2013 | Yeh |
| 8,601,210 | B2 | 12/2013 | Jibbe et al. |
| 8,751,904 | B2 | 6/2014 | Wang et al. |
| 8,954,693 | B2 | 2/2015 | Seo et al. |
| 9,063,874 | B2 | 6/2015 | Zhong et al. |
| 2003/0071653 | A1 | 4/2003 | Carberry et al. |
| 2008/0059695 | A1 | 3/2008 | Tanaka et al. |
| 2008/0126742 | A1 | 5/2008 | Shupak et al. |
| 2008/0137419 | A1 | 6/2008 | Cernea |
| 2009/0216936 | A1 | 8/2009 | Chu et al. |
| 2011/0154158 | A1 | 6/2011 | Yurzola et al. |
| 2012/0063533 | A1 | 3/2012 | Fonseka et al. |
| 2012/0072801 | A1 | 3/2012 | Takeuchi et al. |
| 2012/0260150 | A1 | 10/2012 | Cideciyan et al. |
| 2013/0013974 | A1 | 1/2013 | Cideciyan et al. |
| 2013/0114339 | A1 | 5/2013 | Kawamura et al. |
| 2013/0132504 | A1 | 5/2013 | Kohli et al. |
| 2013/0151803 | A1 | 6/2013 | Tofano |
| 2013/0179752 | A1* | 7/2013 | Shim ................. G06F 11/1004 714/773 |
| 2013/0246721 | A1 | 9/2013 | Fukutomi et al. |
| 2013/0318051 | A1 | 11/2013 | Kumar et al. |
| 2014/0026013 | A1 | 1/2014 | Koseki |
| 2014/0032861 | A1 | 1/2014 | Islam et al. |
| 2014/0258628 | A1 | 9/2014 | Shivashankaraiah et al. |
| 2015/0154118 | A1* | 6/2015 | Marcu ................. G06F 12/1009 711/206 |
| 2015/0220277 | A1* | 8/2015 | Lee ...................... G06F 3/064 711/103 |
| 2015/0227418 | A1 | 8/2015 | Cai et al. |
| 2016/0048354 | A1* | 2/2016 | Walsh ................. G06F 12/0246 711/103 |
| 2016/0077960 | A1* | 3/2016 | Hung ................. G06F 12/0246 711/103 |
| 2016/0132392 | A1 | 5/2016 | Ioannou et al. |

FOREIGN PATENT DOCUMENTS

| | | |
|---|---|---|
| CN | 103941116 A | 7/2014 |
| CN | 104123238 A | 10/2014 |
| EP | 1632845 A2 | 3/2006 |
| EP | 2823401 A1 | 1/2015 |
| KR | 101379883 B1 | 4/2014 |
| WO | WO8909468 A1 | 10/1989 |
| WO | 2007084751 A2 | 7/2007 |
| WO | WO2013147819 A1 | 10/2013 |

OTHER PUBLICATIONS

International Business Machines Corporation, UK Patent Application No. 1407279.7, filed Apr. 25, 2014.

Justesen, J., "Error Correcting Coding for OTN," IEEE Communications Magazine, ITU-T Optical Transport Network, Sep. 2010, pp. 70-75.

Justesen, J., "Performance of Product Codes and Related Structures with Iterated Decoding," IEEE Transactions on Communications, vol. 59, No. 2, Feb. 2011, pp. 407-415.

Lim, H. et al., "SILT: A Memory-Efficient, High-Performance Key-Value Store," SOSP '11, Oct. 23-26, 2011, pp. 1-13.

Redmill D.W. et al., "The EREC: An Error-Resilient Technique for Coding Variable-Length Blocks of Data," IEEE Transactions on Image Processing, vol. 5, No. 4, Apr. 1996, pp. 565-574.

Van, V. T. et al., "A Novel Error Correcting System Based on Product Codes for Future Magnetic Recording Channels," 2011, pp. 1-4.

Wu, G. et al., "Reducing SSD Read Latency via NAND Flash Program and Erase Suspension," 2012, pp. 1-7.

Yang, C. et al., Product Code Schemes for Error Correction in MLC NAND Flash Memories, IEEE Transactions on Very Large Scale Integration (VLSI) Systems, 2011, pp. 1-13.

Ioannou et al., U.S. Appl. No. 14/536,550, filed Nov. 7, 2014.

Statement of Relevance of Non-Translated Foreign Document for CN101958720.

List of IBM Patents or Patent Applications Treated as Related.

Zuck, A. et. al., "Compression and SSD: Where and How?" Inflow, Oct. 5, 2014, pp. 1-10.

Chen, X. et. al., "C-Pack: A High-Performance Microprocessor Cache Compression Algorithm," IEEE Transactions on Very Large Scale Integration (VLSI) Systems, vol. 18, No. 8, Aug. 2010, pp. 1196-1208.

Sadler, C. et. al., "Data Compression Algorithms for Energy-Constrained Devices in Delay Tolerant Networks," SenSys '06, Nov. 1-3, 2006, pp. 265-278.

Camp et al., U.S. Appl. No. 14/864,666, filed Sep. 24, 2015.

Gupta et al., "DFTL: A Flash Translation Layer Employing Demand-based Selective Caching of Page-level Address Mappings," ASPLOS '09, Mar. 7-11, 2009, pp. 1-12.

Ioannou et al., U.S. Appl. No. 14/945,228, filed Nov. 18, 2015.

Final Office Action from U.S. Appl. No. 14/536,550, dated Dec. 29, 2016.

* cited by examiner

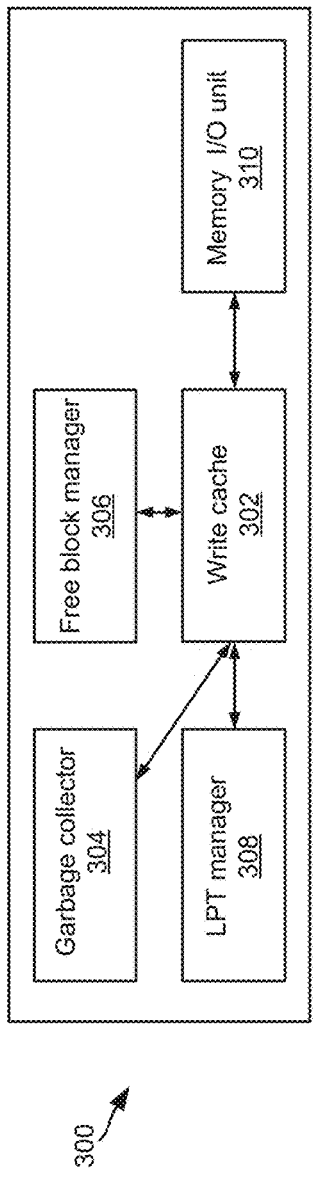
FIG. 3
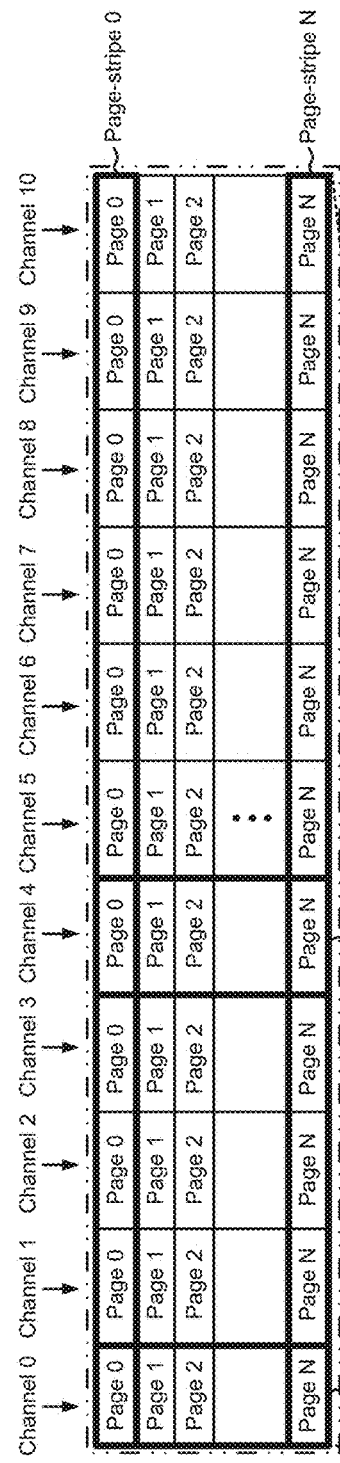
FIG. 4
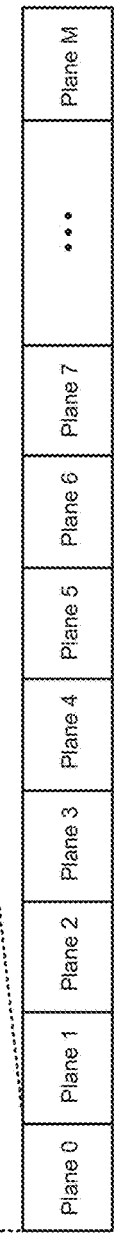

WORKLOAD-ADAPTIVE DATA PACKING ALGORITHM

BACKGROUND

The present invention relates to data storage systems, and more particularly, this invention relates to workload-adaptive algorithms for packing compressed logical pages into error correction code (ECC) codewords.

Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

However, in Flash-based SSDs, memory locations are erased in blocks prior to being written to. The size of an erase block unit is typically 256 pages and the erase operations takes approximately one order of magnitude more time than a page program operation. Due to the intrinsic properties of NAND Flash, Flash-based SSDs write data out-of-place whereby a mapping table maps logical addresses of the written data to physical ones. This mapping table is typically referred to as the Logical-to-Physical Table (LPT).

As Flash-based memory cells exhibit read errors and/or failures due to wear or other reasons, additional redundancy may be used within memory pages as well as across memory chips (e.g., RAID-5 and RAID-6 like schemes). The additional redundancy within memory pages may include ECC codewords which, for example, may include Bose, Chaudhuri, and Hocquenghem (BCH) codes. Logical pages of memory may be packed into payloads of ECC, whereby the ECC codewords may be used to recover data of the corresponding logical pages.

However, the implementation of ECC codewords with respect to the logical pages of memory has been undesirable in conventional products. Specifically, ECC codewords have a fixed payload size, which limits the amount of data the ECC codeword can protect. Moreover, the fixed payload size of the ECC codewords is not well aligned with the size of uncompressed logical pages in memory. Furthermore, some non-volatile memory systems implement compression of the logical pages in memory, whereby a compressor will compress each logical page to a different size (e.g., length) than its original size. However, the length of a compressed logical page varies depending on the particular logical page and therefore the lengths of various compressed logical pages are inconsistent. This variety in compressed lengths exacerbates the misalignment experienced between the fixed payload size of ECC codewords and the logical pages when compressed logical pages are packed into payloads of ECC codewords.

Conventional attempts to fill the entire payload of ECC codewords result in compressed logical pages undesirably straddling between ECC codewords, thereby resulting in read amplification by requiring that two full ECC codewords be read and transferred from non-volatile memory to a controller in order to read back the single, straddled logical page. Straddling also increase latency when the straddling occurs across a physical page boundary, thereby requiring that two physical pages be read in addition to transferring two full ECC codewords from memory to a controller.

It follows that, a method which overcomes the aforementioned conventional shortcomings by providing an efficient method of filling ECC codeword payloads is greatly desired.

BRIEF SUMMARY

A method, according to one embodiment, includes selecting, from a buffer, a combination of compressed logical pages of data to maximize an amount of used space in an error correction code container. The method also preferably includes processing the combination of compressed logical pages to generate error correction code data. Furthermore, the method may include writing the data corresponding to the combination of compressed logical pages and the associated error correction code data to a non-volatile random access memory. As a result, methods according to the present embodiment are desirably able to provide a desirable process of filling error correction code containers, preferably by implementing aligned packing schemes which efficiently pack compressed logical pages into error correction code containers.

Moreover, it is preferred that all compressed logical pages in the buffer are considered during the selection made in such methods, thereby increasing the number of compressed logical pages determined during the selection.

According to some approaches, the selection described above may include concurrently selecting multiple combinations of compressed logical pages of data to maximize amounts of used space in multiple error correction code containers. The ability to concurrently select multiple combinations of compressed logical pages of data allows for increased efficiency and faster data processing rates while ensuring efficient use of error correction code container space without introducing undue read amplification and/or latency as experienced by conventional products.

Furthermore, according to other approaches, the combination of compressed logical pages may fill only a portion of the error correction code container. It may be desirable to allow partial filling of an ECC container when using aligned packing schemes and adding any additional compressed logical page available in the buffer would require straddling. Thus, in some instances, it may be desirable to sacrifice ECC container packing efficiency in order to prevent the read amplification and/or latency experienced in conventional products, resulting from straddling.

According to some embodiments, the method may also optionally include determining whether an amount of unused space in the error correction code container after adding the combination of compressed logical pages thereto is above a threshold. In response to a determination that the amount of unused space in the error correction code container after the addition of the combination of compressed logical pages thereto is above the threshold a first portion of an additional compressed logical page may be added to the error correction code container. Further still, a second portion of the additional compressed logical page may be added to a second error correction code container. Moreover, the second error code container may have previously written compressed logical pages therein, thereby enabling some embodiments to desirably increase the capacity of error correction code containers as compressed logical pages become available.

According to other embodiments, the method may also optionally include determining that at least some of the compressed logical pages in the buffer are not substantially compressed. Moreover, such optional embodiments may include selecting one of the compressed logical pages that is not substantially compressed and adding a first portion of the selected one of the compressed logical pages that is not substantially compressed to the error correction code container. Additionally, a second portion of the selected one of the compressed logical pages that is not substantially compressed may be added to a second error correction code container. Thus, selective straddling may optionally be enabled in some embodiments to avoid the waste of undesirable amounts of error correction code container capacity. By selectively implementing straddling between correction code containers in certain situations, some embodiments may be able to perform adaptive packing, whereby both tight packing (e.g., using straddling) and aligned packing may be implemented interchangeably as will be described in further detail below.

A computer program product, according to another embodiment, includes a computer readable storage medium having program instructions embodied therewith. The program instructions are preferably readable and/or executable by a controller to cause the controller to: select, by the controller, a combination of compressed logical pages of data from a buffer to maximize an amount of used space in an error correction code container. The program instructions are also preferably readable and/or executable by a controller to cause the controller to: process, by the controller, the combination of compressed logical pages to generate error correction code data. Furthermore, the program instructions are also preferably readable and/or executable by a controller to cause the controller to: write, by the controller, the data corresponding to the combination of compressed logical pages and the associated error correction code data to a non-volatile random access memory.

A system, according to yet another embodiment, includes non-volatile random access memory (NVRAM) configured to store data; and a processor and logic integrated with and/or executable by the processor. The logic integrated with and/or executable by the processor is preferably configured to: select a combination of compressed logical pages of data from a buffer to maximize an amount of used space in an error correction code container. Moreover, the logic is also preferably configured to: process the combination of compressed logical pages to generate error correction code data. Further still, the logic is also preferably configured to: write the data corresponding to the combination of compressed logical pages and the associated error correction code data to a non-volatile random access memory.

A method, according to yet another embodiment, includes determining whether compressed logical pages of data in a buffer are substantially compressed. The method may also include selecting a first combination of compressed logical pages that are substantially compressed to add to an error correction code container to maximize an amount of used space in the error correction code container. Method may additionally include selecting a second combination of the compressed logical pages that are not substantially compressed to add to the error correction code container to maximize an amount of used space in the error correction code container. Moreover, the first combination and/or second combination of compressed logical pages may be processed to generate error correction code data. Furthermore, the data corresponding to the first combination and/or second combination of compressed logical pages and associated error correction code data may be written to a non-volatile random access memory. By enabling selection of a first and/or second combination of compressed logical pages to add to an error correction code container, a method may be able to desirably increase storage capacity of ECC containers. Different packing schemes may be selectively performed depending on the extent of compression of the compressed logical pages. According to some approaches, selective straddling may optionally be enabled to avoid the waste of undesirable amounts of error correction code container capacity, e.g., when the compressed logical pages are not substantially compressed, as will be described in further detail below.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 3 is a system diagram, in accordance with one embodiment.

FIG. 4 is a conceptual diagram which includes a block-stripe and page-stripe, in accordance with one embodiment.

DETAILED DESCRIPTION

Figure 1:
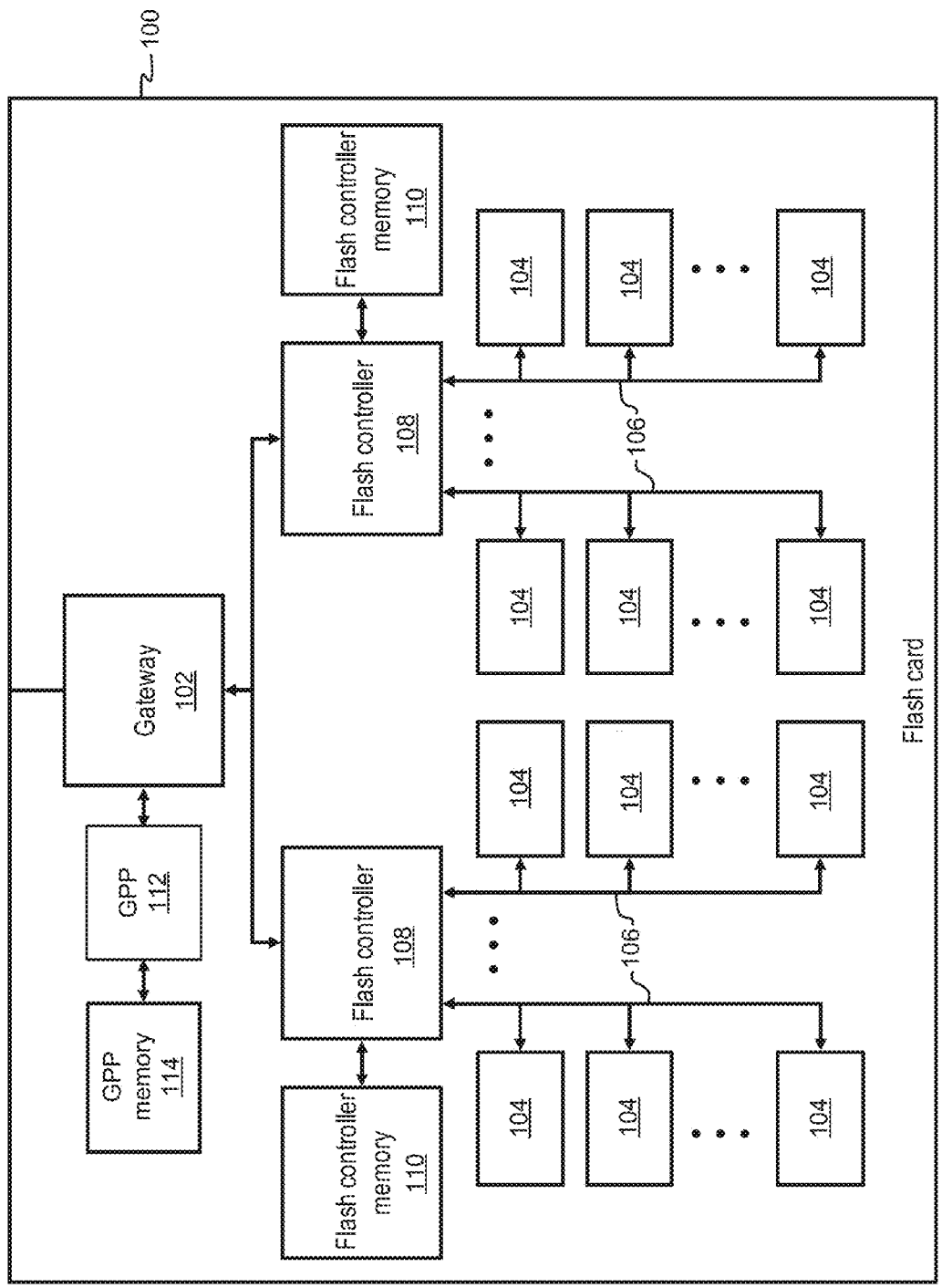
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example non-volatile random access memory (NVRAM) technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a method includes selecting, from a buffer, a combination of compressed logical pages of data to maximize an amount of used space in an error correction code container. The method also preferably includes processing the combination of compressed logical pages to generate error correction code data. Furthermore, the method may include writing the data corresponding to the combination of compressed logical pages and the associated error correction code data to a non-volatile random access memory.

In another general embodiment, a computer program product includes a computer readable storage medium having program instructions embodied therewith. The program instructions are preferably readable and/or executable by a controller to cause the controller to: select, by the controller, a combination of compressed logical pages of data from a buffer to maximize an amount of used space in an error correction code container. The program instructions are also preferably readable and/or executable by a controller to cause the controller to: process, by the controller, the combination of compressed logical pages to generate error correction code data. Furthermore, the program instructions are also preferably readable and/or executable by a controller to cause the controller to: write, by the controller, the data corresponding to the combination of compressed logical pages and the associated error correction code data to a non-volatile random access memory.

In yet another general embodiment, a system includes non-volatile random access memory (NVRAM) configured to store data; and a processor and logic integrated with and/or executable by the processor. The logic integrated with and/or executable by the processor is preferably configured to: select a combination of compressed logical pages of data from a buffer to maximize an amount of used space in an error correction code container. Moreover, the logic is also preferably configured to: process the combination of compressed logical pages to generate error correction code data. Further still, the logic is also preferably configured to: write the data corresponding to the combination of compressed logical pages and the associated error correction code data to a non-volatile random access memory.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
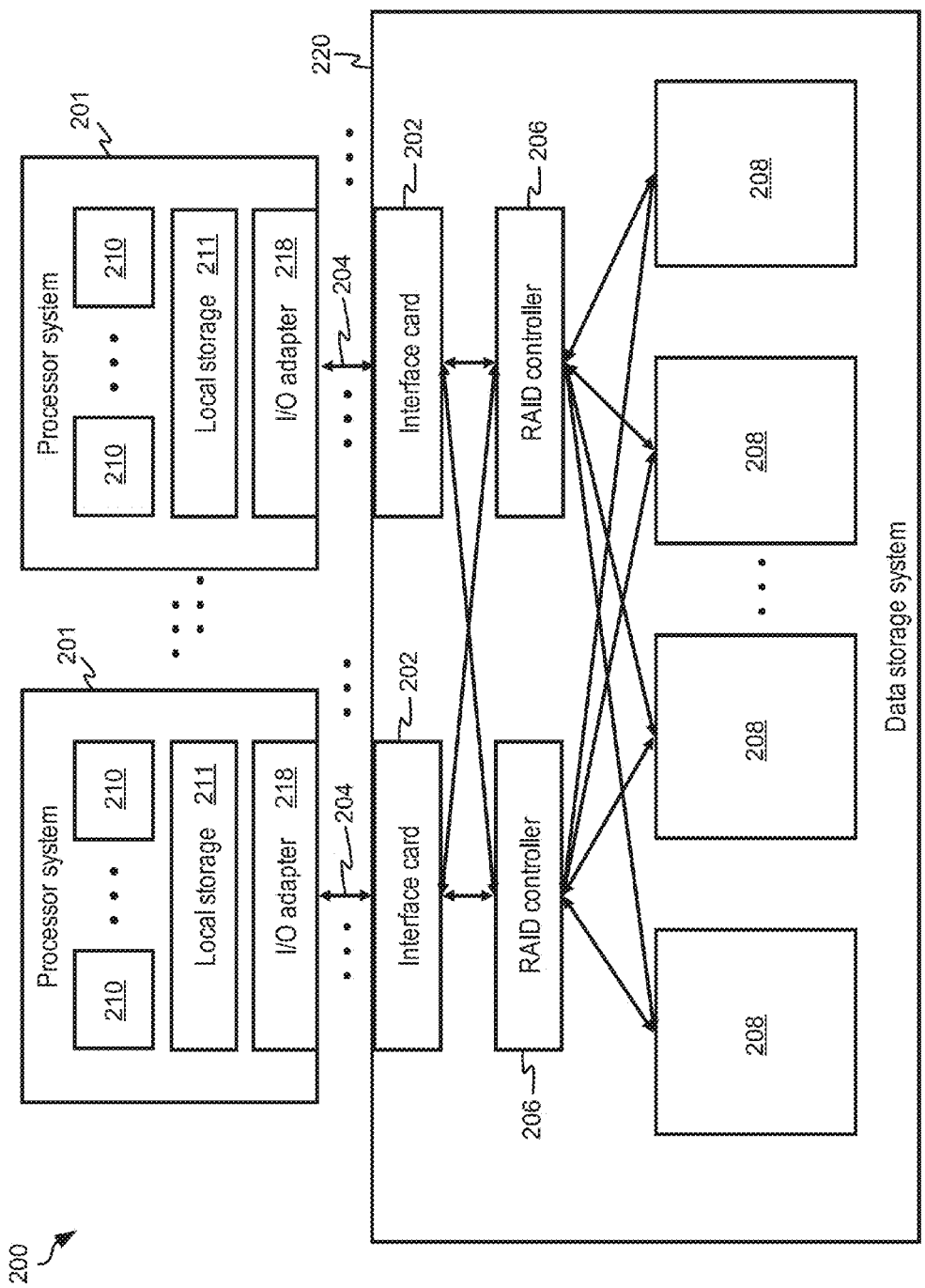
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more RAID controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-10, or some other suitable parity scheme, as would be understood by one of skill in the art upon reading the present descriptions.

Figure 13:
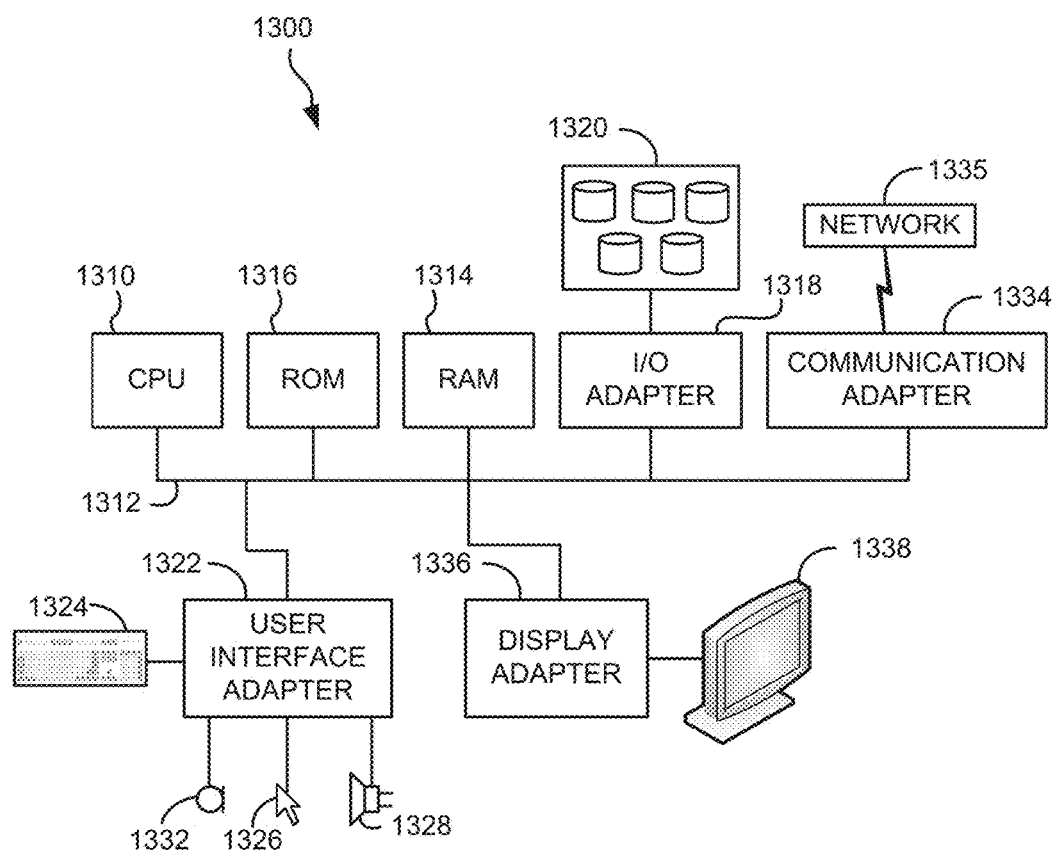
FIG. 13 is a representative hardware environment that may be associated with the servers and/or clients of FIG. 12, in accordance with one embodiment.

Each processor system 201 comprises one or more processors 210 (such as CPUs, microprocessors, etc.), local data storage 211 (e.g., such as RAM 1314 of FIG. 13. ROM 1316 of FIG. 13, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, block-stripes may be identified for being reclaimed and/or relocated.

The unit of the garbage collection operation is also referred to herein as the Logical Erase Block (LEB). It should also be noted that an LEB include any multiple of the physical memory block, which is a unit of physical erasure. Moreover, the organization of memory blocks into LEBs allows for adding RAID-like parity protection schemes among memory blocks from different memory chips, memory planes and/or channels as well as significantly enhancing performance through higher parallelism.

According to an exemplary embodiment, which is in no way intended to limit the invention, memory controllers (e.g., see 108 of FIG. 1) may internally perform a garbage collection. As previously mentioned, the garbage collection may include selecting a block-stripe to be relocated, after which all data that is still valid on the selected block stripe may be relocated (e.g., moved). After the still valid data has been relocated, the entire block-stripe may be erased and thereafter, used for storing new data. The amount of data relocated from the garbage collected block-stripe determines the write amplification. Moreover, an efficient way to reduce the write amplification includes implementing heat segregation.

Heat Segregation

In the present context, the "heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

It should be noted that the number of read requests to and/or read operations performed on a memory block may not come into play when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar heat values, heat segregation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat segregation is two-fold. First, performing a garbage collection process on a hot memory block will prevent triggering the relocation of cold data as well. In the absence of heat segregation, updates to hot data, which are performed frequently, also results in the undesirable relocations of all cold data collocated on the same LEB as the hot data being relocated. Therefore the write amplification incurred by performing garbage collection is much lower for embodiments implementing heat segregation.

Secondly, the relative heat of data can be utilized for wear leveling purposes. For example, hot data may be placed in younger (e.g., healthier) memory blocks, while cold data may be placed on older (e.g., less healthy) memory blocks relative to those younger memory blocks. Thus, the rate at which relatively older blocks are exposed to wear is effectively slowed, thereby improving the lifetime of a given data storage system implementing heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

To better understand the distinction between block-stripes and page-stripes as used herein, FIG. 4 is a conceptual diagram 400, in accordance with one embodiment. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4 may be implemented in a cache architecture. However, depending on the desired embodiment, the conceptual diagram 400 of FIG. 4 may be implemented in defining the organization of data stored in non-volatile memory. Accordingly, both implementations are described in turn below.

Non-Volatile Memory

Looking now to FIG. 4, the conceptual diagram 400 includes a set of M+1 planes labeled "Plane 0" through "Plane M". When implemented with data stored in non-volatile memory, each plane on a channel may include a large set of blocks, e.g., typically in the order of 1024, 2048 or more. Moreover, one or more plane may also include several additional blocks which may be used as replacement blocks for bad blocks (e.g., blocks performing poorly, blocks having undesirable characteristics, etc.).

In each plane of non-volatile memory, a single block from each channel may form a respective block-stripe. It follows that a number of block-stripes supported by a given embodiment of non-volatile memory may be determined by the number of blocks per plane and channel.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4, each block of pages illustrated in the exploded view of Plane 0 may constitute a unique block when implemented in a cache architecture. Similarly, each channel may correspond to a single, individual block. For example, looking to conceptual diagram 400, Block 10 includes all pages (Page 0 through Page N) in Channel 0 while Block 41 corresponds to all pages in Channel 4, and so on.

In the context of a memory controller, e.g., which may be capable of implementing RAID at the channel level, a block-stripe is made up of multiple blocks which amount to a stripe of blocks. Looking still to FIG. 4, the multiple blocks of Plane 0 constitute Block-stripe 0. While all blocks in a block-stripe typically belong to the same plane, in some embodiments one or more blocks of a block-stripe may belong to different planes. It follows that each plane may include a block-stripe. Thus, according to an illustrative embodiment, Block 0 through Block 10 may constitute a block-stripe.

Regardless of whether the conceptual diagram 400 of FIG. 4 is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 256 pages, but could include more or less in various embodiments. Analogously, the number of channels per plane and/or the number of planes may vary depending on the desired embodiment.

Referring still to FIG. 4, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

As non-volatile based memory cells exhibit read errors and/or failures due to wear or other reasons, additional redundancy may be used within memory pages as well as across memory chips (e.g., RAID-5 and RAID-6 like schemes). The additional redundancy within memory pages may include ECC codewords which, for example, may include BCH codes.

As previously mentioned, logical pages of memory may be packed into payloads of ECC codewords, whereby the ECC codewords may be used to recover data of the corresponding logical pages. However, the implementation of ECC codewords with respect to the logical pages of memory has been undesirable in conventional products. Specifically, ECC codewords have a fixed payload size, which limits the amount of data an ECC codeword can accommodate, and the fixed payload size of the ECC codewords is not well aligned with the size of uncompressed logical pages in memory. Furthermore, some non-volatile memory systems implement compression of the logical pages in memory, whereby a compressor will compress each logical page to a size (e.g., length) different than its original size. Moreover, the length of a compressed logical page varies depending on the particular logical page and therefore the lengths of various compressed logical pages are inconsistent. This variety in compressed lengths exacerbates the misalignment experienced between the fixed payload size of ECC codewords and the logical pages when compressed logical pages are packed into payloads of ECC codewords.

Conventional attempts to fill the entire payload of ECC codewords (also referred to herein as "tight packing") result in compressed logical pages undesirably straddling between ECC codewords. As a result, read amplification is increased by requiring that two full ECC codewords be read and transferred from non-volatile memory (e.g., to a controller) in order to read back a single, straddled logical page. Straddling also increases latency when the straddling occurs across a physical page boundary, thereby requiring that two physical pages be read in addition to transferring two full ECC codewords from memory. Thus, the penalty for straddling is having to read multiple pages and being required to return a larger amount of data than desired. It follows that, a method which overcomes the aforementioned conventional shortcomings by providing an efficient method of filling ECC codeword payloads is greatly desired.

In sharp contrast to the foregoing issues experienced using conventional products, various embodiments described and/or suggested herein include workload-adaptive algorithms for implementing aligned packing schemes which efficiently pack compressed logical pages into ECC codewords, e.g., using dynamic programming. Thus, storage environments which implement a large variety in the length of compressed logical pages may implement some of the various embodiments described herein in order to pack the compressed logical pages into ECC codeword payloads (also referred to herein as ECC containers) in such a way that the probability of having a straddling events occur is minimized while also ensuring an efficient use of the ECC container itself, particularly compared to conventional approaches.

Figure 5A:
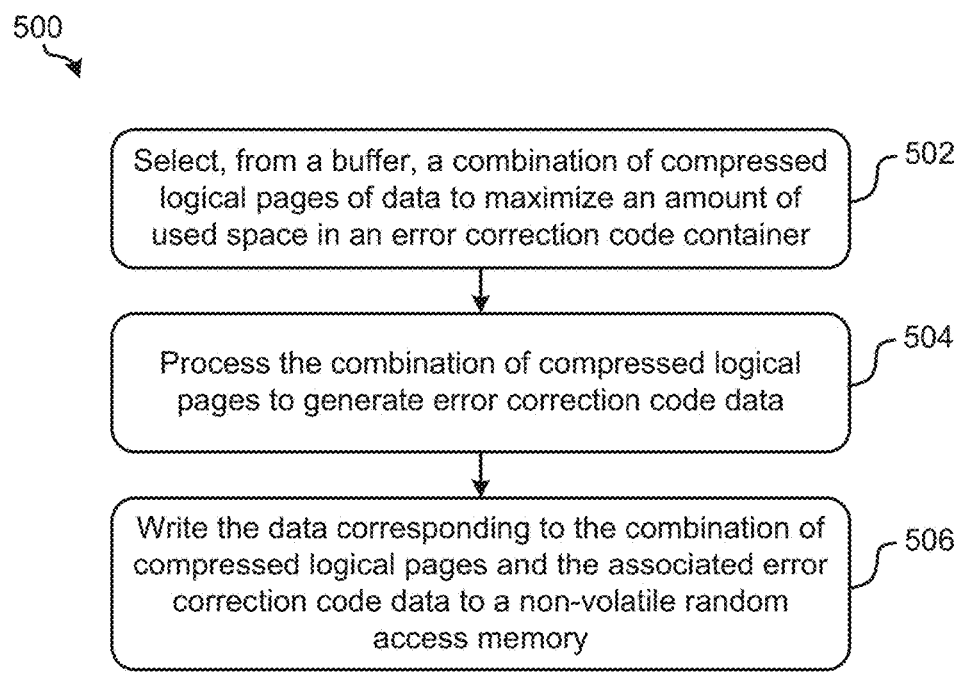
FIG. 5A is a flowchart of a process, in accordance with one embodiment.

FIG. 5A illustrates a flowchart of a method 500 for implementing an aligned packing scheme is shown according to one embodiment. The method 500 may be performed in accordance with the present invention in any of the environments depicted in FIGS. 1-4, among others, in various embodiments. More or less operations than those specifically described in FIG. 5A may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As illustrated in FIG. 5A, method 500 includes operation 502 where a combination of compressed logical pages of data is selected from a buffer to maximize an amount of used space in an ECC container (e.g., an ECC codeword payload). It should be noted that, although operation 502 is described as maximizing an amount of used space in an ECC container, method 500 may equivalently attempt to minimize an amount of unused space in the ECC container.

Once compressed, a logical page may have a different length than another compressed logical page. According to an example, which is in no way intended to limit the invention, first and second logical pages may both have an uncompressed length of 265 128-bit words. However, after both of the first and second pages are compressed (e.g., by a compressor), the length of the first logical page may be reduced to a compressed length of 50 128-bit words, while the length of the second logical page may only be reduced to a compressed length of 200 128-bit words. According to another example, again which is in no way intended to limit the invention, a logical page with an uncompressed length of 265 128-bit words may only be shortened to a compressed length of 260 128-bit words after being compressed. Furthermore, some logical pages may not be compressible at all, e.g., if they have already been compressed during a previous logical process. It follows that, according to various embodiments, the length of a compressed logical page varies depending on the particular logical page, and therefore the lengths of various compressed logical pages are inconsistent.

Accordingly, depending on the size of an ECC container and/or the compressed lengths of various compressed logical pages available, certain combinations of compressed logical pages may utilize the available space in an ECC container more efficiently than other combinations, e.g., preferably without straddling to another ECC container. Thus, embodiments which implement the selection performed in operation 502 are able to overcome conventional shortcomings by efficiently grouping compressed logical pages together to maximize use of ECC containers without straddling, as will be described in further detail below.

Referring still to FIG. 5A, the combination of compressed logical pages is processed to generate error correction code data. See operation 504. Once a desired number of compressed logical pages have been packed into an ECC codeword container, the ECC containers may be sent to an ECC encoder which adds a number of parity bits to the container. Furthermore, operation 506 includes writing the data corresponding to the combination of compressed logical pages and the associated error correction code data to a nonvolatile random access memory. Once the parity bits have been added, the whole sequence of compressed logical pages and the parity bits are written to non-volatile memory, after which, the ECC container may be reused in subsequent processes.

Figure 5B:
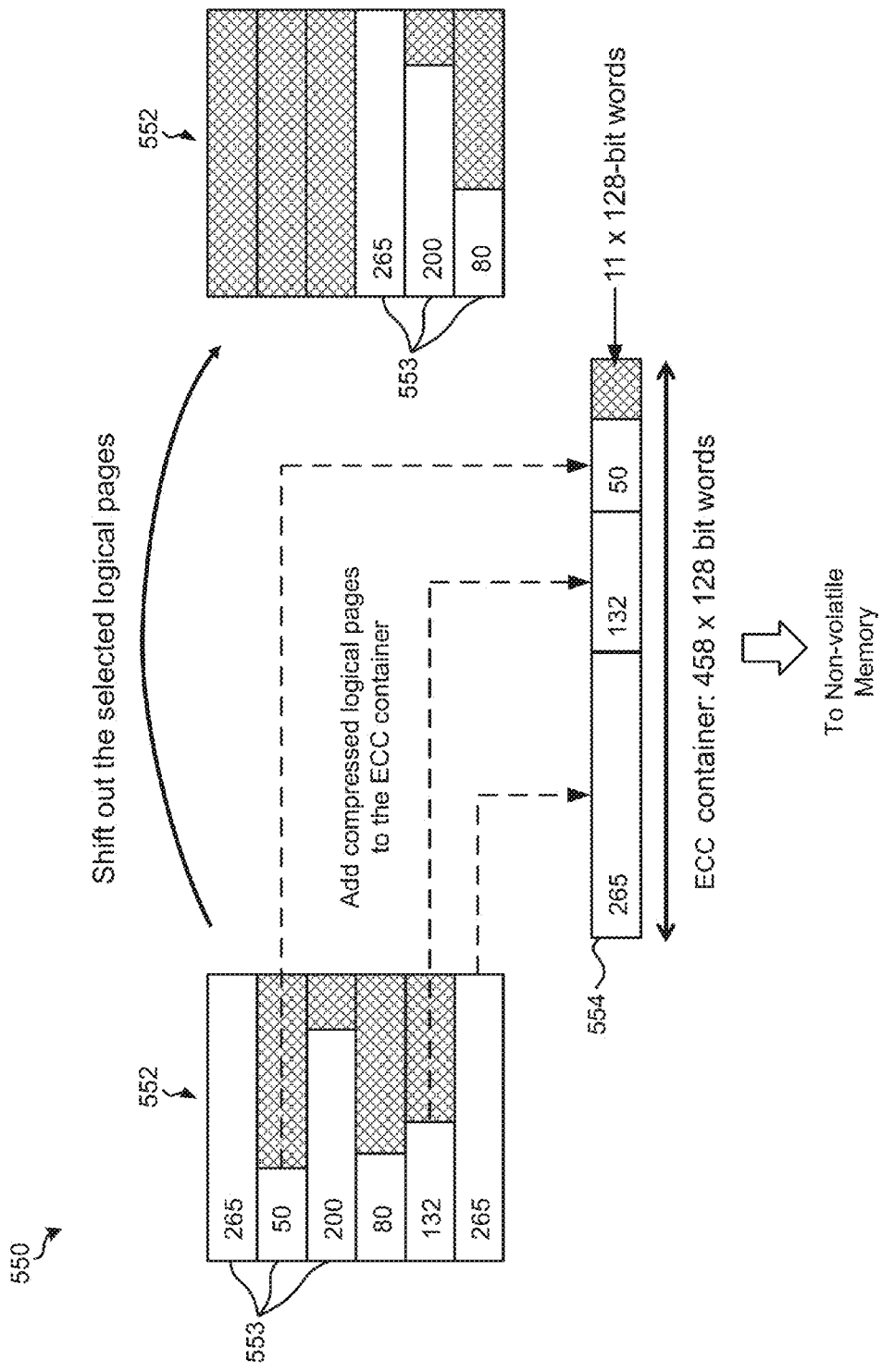
FIG. 5B is a representative diagram, in accordance with an illustrative embodiment.

A visual example of how method 500 may be implemented is shown in the representative diagram 550 of FIG. 5B. As a preliminary matter, it should be noted that although the representative diagram 550 includes illustrative values for the lengths of compressed logical pages 553, buffer 552 and ECC codeword container 554, these values are presented by way of example only and are in no way intended to limit the invention.

Looking to the representative diagram 550 in FIG. 5B, the compressed logical pages 553 in buffer 552 have different lengths, which have been represented by the size of each respective compressed logical page and their corresponding length value depicted in each of the compressed logical pages 553. Moreover, ECC container 554 is illustrated as having an exemplary length of 458 128-bit words, which is in no way intended to limit the invention. As previously mentioned, depending on the compressed logical pages 553 available in buffer 552, a combination of compressed logical pages 553 may be selected from the buffer 552 and added to the ECC container 554. However, depending on the size of the ECC container 554 and/or the compressed lengths of various compressed logical pages 553 available, certain combinations of compressed logical pages 553 may utilize the available space in an ECC container 554 more efficiently than other combinations. Thus, by selecting a combination of compressed logical pages 553 to add to the ECC container 554 which maximizes the use of the ECC container 554 without straddling, the present embodiment is able to overcome conventional shortcomings.

According to the illustrative embodiment presented in the representative diagram 550, only eleven 128-bit words of the ECC container 554 have not been used. Moreover, it may be undesirable to add an additional compressed logical page to the ECC container 554 in view of the straddling which would be required to do so, as none of the remaining compressed logical pages 553 available in buffer 552 have a length less than or equal to eleven 128-bit words.

After the selected combination of compressed logical pages 553 have been added to the ECC container 554, the ECC container 554 may be sent to an ECC encoder and/or the data corresponding to the combination of compressed logical pages may be written to a non-volatile random access memory. Additionally, the remaining compressed logical pages in the buffer 552 may be rearranged such that additional compressed logical pages may be received. It should be noted that if a compressed logical page fitting within the free space of the ECC container 554, here another compressed logical page having a length of eleven 128-bit words or less, is received in the buffer 552 before the ECC container 554 is sent to be processed, the newly received compressed logical page may be added to the ECC container 554 to utilize the remaining space available therein.

Referring again to FIG. 5A, it is preferred that all compressed logical pages in the buffer are considered during the selection of operation 502. This desirably allows for the maximum number of compressed logical page combinations to be considered when filling an ECC container, thereby ensuring the most efficient use of the ECC container. However, according to different approaches, the selection performed in operation 502 may vary as desired. Thus, although it is preferred that all compressed logical pages in the buffer are considered during the selection, in other approaches, only a subset of the compressed logical pages may be considered during the selection. According to an example, only compressed logical pages which have been substantially compressed (e.g., as opposed to being not substantially compressed) may be considered during the selection performed in operation 502 as will soon become apparent.

Depending on the compressed length of a compressed logical page compared to its uncompressed length, the compressed logical page may be considered substantially compressed or not substantially compressed. According to an illustrative approach, compressed logical pages having a compressed length which is 95% or more of their uncompressed length may be considered not substantially compressed, while compressed logical pages having a compressed length which is less than 95% of their uncompressed length may be considered substantially compressed. Thus, according to an example, a logical page having an uncompressed length of 265 128-bit words which is compressed to a length of 255 128-bit words (i.e., about 96% of its uncompressed length) may be determined to be not substantially compressed. According to another example, a logical page may be determined to be substantially compressed when it has an uncompressed length of 265 128-bit words which is compressed to a length of 250 128-bit words (i.e., about 94% of its uncompressed length). However, the threshold used to distinguish between compressed logical pages which are substantially compressed and those that are not substantially compressed may be a predetermined and/or selected compressed length, such as 99%, 98%, 97%, 96%, 94%, 93%, 92%, 91%, 90%, 87%, 85%, 83%, 80%, etc. of the original, uncompressed length of the logical page, depending on the desired embodiment.

It is preferred that the selection performed in operation 502 fully fills an ECC container without straddling to another ECC container as often as possible, thereby achieving maximum use of the available space without introducing read amplification and/or latency as experienced by conventional products. However, in some approaches, the combination of compressed logical pages may fill only a portion of an ECC container, i.e., less than 100% thereof. It may be desirable to allow partial filling of an ECC container when using aligned packing schemes and adding any additional compressed logical page available in the buffer would require straddling. Thus, in some instances, it may be desirable for any of the approaches described herein to sacrifice ECC container packing efficiency in order to prevent the read amplification and/or latency experienced in conventional products, e.g., due to straddling.

As alluded to above, depending on the size of an ECC container and/or the compressed lengths of various compressed logical pages available in a buffer, certain combinations of compressed logical pages may utilize the available space in an ECC container more efficiently than other combinations, e.g., preferably without straddling to another ECC container. According to various embodiments, different techniques may be enacted to select a combination of compressed logical pages which desirably maximizes an amount of used space in an ECC container. According to an exemplary embodiment, which is in no way intended to limit the invention, Equation 1 may be used to select a desired combination of compressed logical pages to add to a given ECC container.

$$\text{Maximize } F(\underline{x}) = \sum_{i=1}^{L} x_i l_i, \quad \text{Equation 1}$$

$$\text{subject to the constraint: } F(\underline{x}) \leq K$$

Equation 1 represents a formulation of the problem of selecting a combination of compressed logical pages which desirably maximizes an amount of used space in an ECC container in mathematical form. The variables used in Equation 1 are defined as follows:

L represents the number of compressed logical pages kept in a buffer.

K represents the length of the ECC container measured using units of 128-bit words.

$l_i$ represents the length of the compressed logical page at position "i" in the buffer measured using units of 128-bit words, and can essentially be a random number between 1 and 265.

$x_i$ is the "i-th" element of binary vector x which is defined as being equal to 1 if the compressed logical page at position "i" in the buffer is added into the ECC codeword, and 0 otherwise.

Using these variables, Equation 1 defines a maximization problem over all possible $2^L$ values for the binary vector x. By implementing x as a binary vector, the value of $x_i L_i$ will be either zero, or one multiplied by the length of the compressed logical page at the i-th location in the buffer. Thus, the value of $x_i L_i$ will determine whether the length of a given compressed logical page will contribute to the overall length of data to be included in the ECC container, and thereby determines the combination of compressed logical pages which is implemented.

The function F(x) of Equation 1 is also subject to the constraint that the resulting value of F(x) is equal to, or less than, the length of the ECC container (i.e., K) itself, thereby preventing any overflow. Therefore, the function F(x) essentially evaluates all available combinations of compressed logical pages available in a buffer, and determines the one combination which most efficiently fits in the ECC container by minimizing the wasted space therein without implementing straddling between ECC container boundaries and/or physical page boundaries. Thus, the maximization problem in Equation 1 will determine the combination of compressed logical pages in the buffer at a given time which most efficiently utilizes the open space of an ECC container, thereby minimizing read amplification and read latency.

Those skilled in the art will recognize upon reading the present description that Equation 1 as a statement of the 0/1 Knapsack problem for which values are equal to weights. Similarly, those skilled in the art will recognize upon reading the present description that such problems may be solved with the assistance of the function given in Equation 2.1.

$$m_i(w) = \max\left[\sum_{j=1}^{i} x_j l_j\right] \text{ such that } \sum_{j=1}^{i} x_j l_j \leq w \quad \text{Equation 2.1}$$

The value of this function can be computed recursively, as illustrated by Equation 2.2 as would be appreciated by one skilled in the art upon reading the present description.

$$\forall i = 1, \ldots, L, \forall w = 0, \ldots, K, \quad \text{Equation 2.2}$$

$$m_i(w) = \begin{cases} \max(m_{i-1}(w - l_i) + l_i, m_{i-1}(w)) & l_i \leq w \\ m_{i-1}(w) & \text{otherwise} \end{cases}$$

Again, Equation 2.1 represents a formulation of the problem of selecting a combination of compressed logical pages which desirably maximizes an amount of used space in an ECC container in a mathematical sense. The variables used in Equations 2.1 and 2.2 are defined as follows:

L represents the number of compressed logical pages kept in a buffer.

K represents the length of the ECC container measured using units of 128-bit words.

i represents a variable whose value spans from 1 to L.

w represents a variable whose value spans from 0 to K.

$l_i$ represents the length of the compressed logical page at position "i" in the buffer measured using units of 128-bit words, and can essentially be a random number between 1 and 265.

$l_j$ represents the length of the compressed logical page at position "j" in the buffer measured using units of 128-bit words, and can essentially be a random number between 1 and 265.

x is a binary vector for which the j-th element ($x_j$) is defined as being equal to 1 if the compressed logical page at position "j" in the buffer is added into the ECC codeword, and 0 otherwise.

As will be appreciated by one skilled in the art upon reading the present description, function $m_i(w)$ of Equation 2.1 is updated for all values of i and w according to this recursion presented in Equation 2.2. Thus, by implementing the function $m_i(w)$ using the compressed logical pages of a given buffer, function $m_i(w)$ is able to determine the longest selection of the first i compressed logical pages in the buffer that fit within a given length "w". The solution to Equation 1 is thus given by $m_L(K)$. Moreover, a trace-back procedure may be used to determine the actual optimal binary vector corresponding to an optimal packing combination of compressed logical pages to add to a given ECC container, as will be described in further detail below (e.g., see FIG. 6B).

Figure 6A:
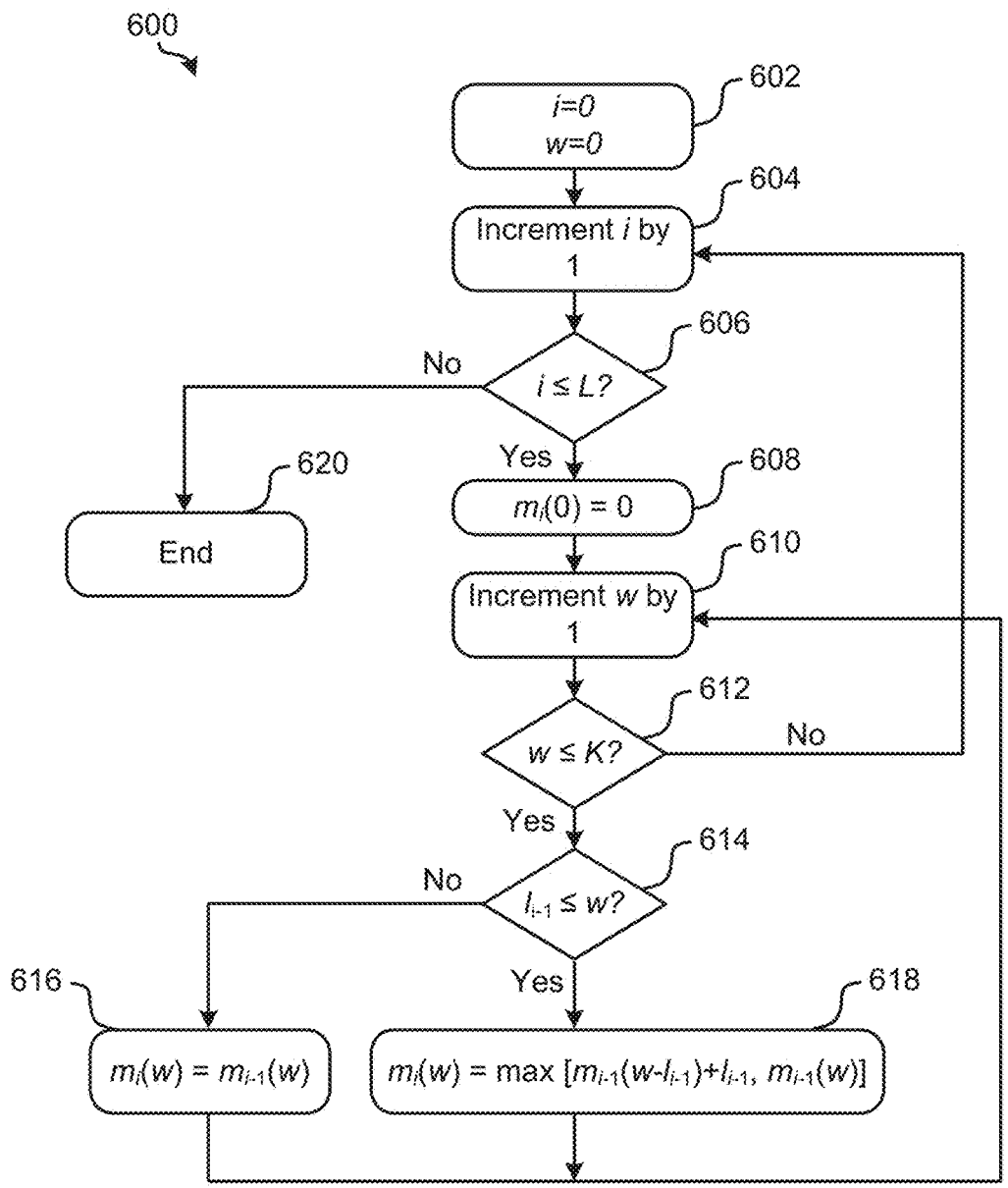
FIG. 6A is a flowchart of a process, in accordance with one embodiment.

FIG. 6A illustrates an exemplary implementation of the forward recursion functions provided in Equation 2.2, according to one embodiment. Moreover, the method 600 illustrated in FIG. 6A may be performed in accordance with the present invention in any of the environments depicted in FIGS. 1-5B, among others, in various embodiments. More or less operations than those specifically described in FIG. 6A may be included in method 600, as would be understood by one of skill in the art upon reading the present descriptions.

Each of the steps of the method 600 may be performed by any suitable component of the operating environment. For example, in various embodiments, the method 600 may be partially or entirely performed by controllers, processors, etc., or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, method 600 includes operation 602, where the value of i is set equal to 0, and the value of w is set equal to 0. Thereafter, operation 604 increments the value of i by 1 from its previous value. Furthermore, decision 606 determines whether the incremented value of i is less than, or equal to the value of L. When decision 606 determines the incremented value of i is less than, or equal to the value of L, method 600 proceeds to operation 608 whereby $m_i(0)$ is set equal to 0.

Method 600 also includes incrementing the value of w by 1 from its previous value. See operation 610. Furthermore, decision 612 determines whether the incremented value of w is less than, or equal to the value of K. When decision 612 determines the incremented value of w is less than, or equal to the value of K, method 600 proceeds to decision 614. However, when decision 612 determines the incremented value of w is greater than the value of K, method 600 returns to operation 604, whereby the value of i is again incremented by 1 from its previous value.

Decision 614 includes determining whether the value of $l_{i-1}$ is less than or equal to the value of w. When decision 614 determines that the value of $l_{i-1}$ is less than or equal to the value of w, method 600 proceeds to operation 618 which includes calculating $m_i(w)=\max [m_{i-1}(w-l_{i-1})+l_{i-1}, m_{i-1}(w)]$. However, when decision 614 determines that the value of $l_{i-1}$ is greater than the value of w, method 600 proceeds to operation 616 which defines the value of $m_i(w)$ equal to the value of $m_{i-1}(w)$.

After performing either operation 616 or 618, method 600 returns to operation 610 whereby the value of w is again incremented by 1. Moreover, returning to decision 606, when it is determined that the value of i is greater than the value of L, method 600 proceeds to operation 620 whereby method 600 is ended.

Figure 6B:
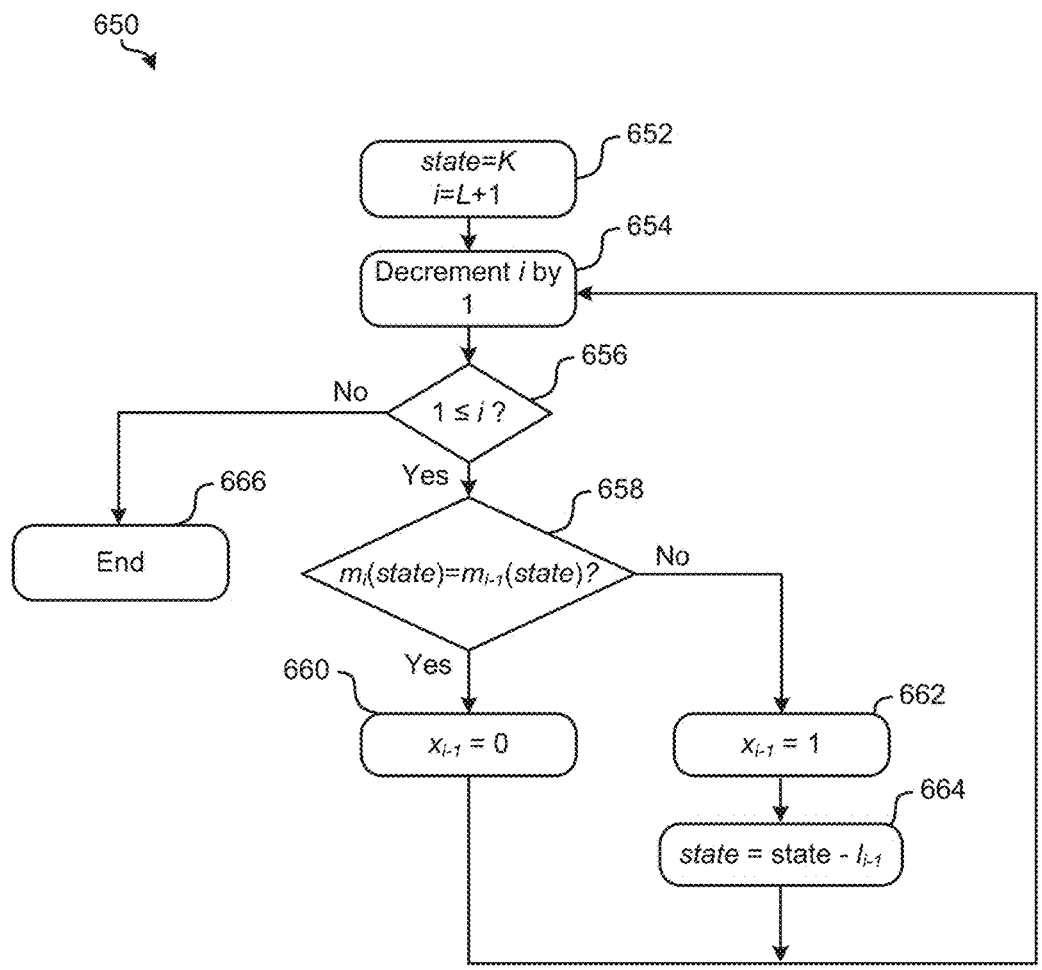
FIG. 6B is a flowchart of a process, in accordance with one embodiment.

As previously mentioned, a trace-back procedure may be used to determine the actual optimal binary vector corresponding to an optimal packing combination of compressed logical pages to add to a given ECC container. Referring now to FIG. 6B, method 650 illustrates an exemplary flowchart which may be used to perform a trace-back procedure, according to one embodiment. Moreover, the method 650 illustrated in FIG. 6B may be performed in accordance with the present invention in any of the environments depicted in FIGS. 1-6A, among others, in various embodiments. More or less operations than those specifically described in FIG. 6B may be included in method 650, as would be understood by one of skill in the art upon reading the present descriptions.

Each of the steps of the method 650 may be performed by any suitable component of the operating environment. For example, in various embodiments, the method 650 may be partially or entirely performed by controllers, processors, etc., or some other device having one or more processors therein. The processor, e.g., processing circuit(s), chip(s), and/or module(s) implemented in hardware and/or software, and preferably having at least one hardware component may be utilized in any device to perform one or more steps of the method 650. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6B, method 650 includes operation 652, where the value of the variable "state" is set equal to the value of K and the value of i is set equal to the value of L+1. Furthermore, operation 654 decrements the value of i by 1, and decision 656 determines whether the decremented value of i is greater than, or equal to 1. When decision 656 determines that the value of i is greater than, or equal to 1, method 650 proceeds to decision 658 which determines whether the value of $m_i(state)$ is equal to the value of $m_{i-1}(state)$.

When decision 658 determines that the values are equal, method proceeds to operation 660 which sets the value of $x_{i-1}$ equal to 0. However, when decision 658 determines that the values are not equal, method proceeds to operation 662 which sets the value of $x_{i-1}$ equal to 1. Additionally, operation 664 includes calculating state=state-$l_{i-1}$.

After performing either operation 660 or 664, method 650 returns to operation 654 whereby the value of i is again decremented by 1. Moreover, returning to decision 656, when it is determined that the value of i is less than 1, method 650 proceeds to operation 666 whereby method 650 is ended.

Figure 7A:
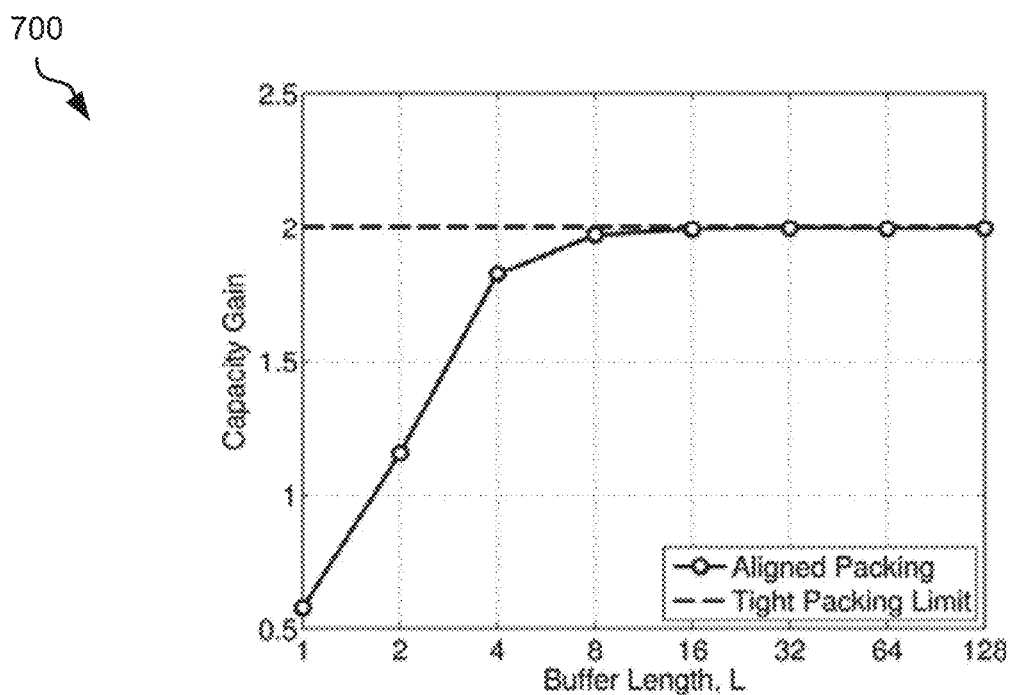
FIG. 7A is a graph of capacity gain with respect to buffer length, in accordance with one embodiment.

FIG. 7A includes a graph 700 which exemplifies illustrative capacity gain with respect to buffer length (number of logical pages that can be stored in the buffer). The dashed line represents a theoretical maximum capacity gain which is achieved by filling all available space in ECC containers (e.g., using tight packing). Furthermore, the points along the solid line represent the capacity gain achieved using the aligned packing algorithm according to different approaches described herein, as a function of the corresponding buffer length.

Although a buffer length of one corresponds to a poor capacity gain for aligned packing implementations, as the buffer length increases, the aligned packing algorithm becomes increasingly effective. Specifically, for buffer lengths of 8, 16 and higher numbers of logical pages, the capacity gain achieved is about two, i.e., the capacity loss due to alignment issues is essentially 0. In other words, implementations of aligned packing as described in the various approaches herein desirably achieves no loss in capacity while also ensuring desirable alignment within the ECC containers, e.g., no straddling between codewords.

Figure 7B:
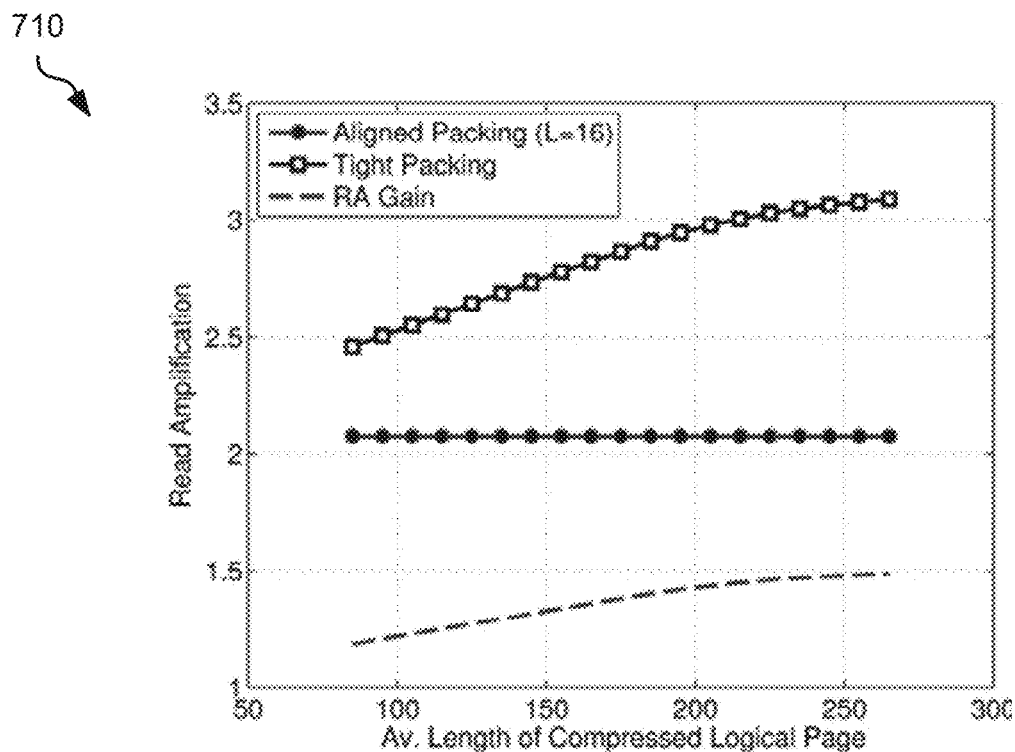
FIG. 7B is a graph of read amplification with respect to the average length of compressed logical pages, in accordance with one embodiment.

FIG. 7B includes a graph 710 which illustrates exemplary read amplification associated with different average lengths of compressed logical pages. Specifically, the graph 710 illustrates the desired read amplification reduction achieved using aligned packing methods as described in different embodiments herein.

As shown, aligned packing implemented using a buffer length of 16 is able to achieve a constant read amplification of about 2.1 while tight packing results in much higher read amplification levels, particularly as the average length of compressed logical pages increases. The dashed line indicates the difference in read amplification experienced between tight and aligned packing, thereby outlining the undesirable amount of increased read amplification experienced using tight packing techniques as opposed to aligned packing methods as described herein.

Figure 7C:
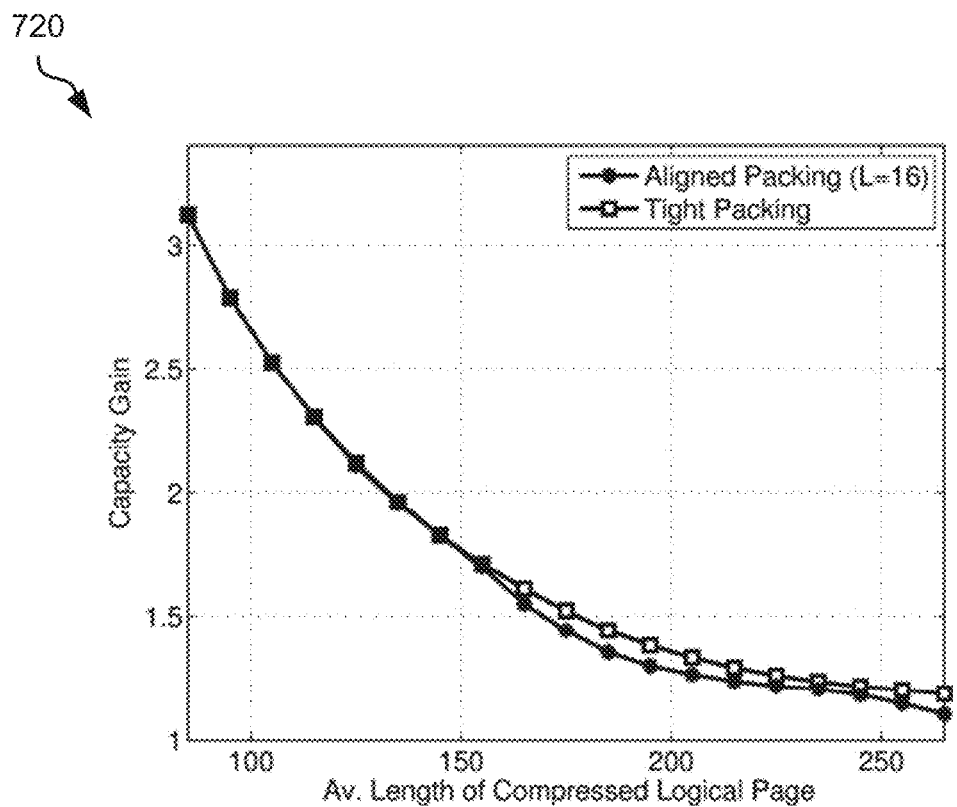
FIG. 7C is a graph of capacity gain with respect to the average length of compressed logical pages, in accordance with one embodiment.

Furthermore, FIG. 7C includes another graph 720 which depicts exemplary capacity gain with respect to the average length of a compressed logical page in a given buffer. As shown, capacity gains achieved using tight packing (which fills the whole ECC container) in this example is nearly the same as the capacity gains achieved using aligned packing methods (having a buffer length of 16) for lower average lengths of the compressed logical pages. There is effectively no capacity loss experienced when the average length of the compressed logical pages is below 150 128-bit words.

However, larger average lengths of the compressed logical pages produce a different result with respect to the performances of these two schemes depicted in graph 720. Specifically, requirements associated with aligned packing for compressed logical pages having average lengths greater than about 150 128-bit words have produced capacity losses of up to about 10% compared to the capacity gains achieved using tight packing. Thus, aligned packing is preferably implemented in embodiments having compressed logical pages with a low average length.

It follows that performance also depends on the statistics of the compressed logical pages. If the statistics of the compressed logical pages are such that the logical pages are not very compressible, then it is less likely that an aligned packing algorithm will be able to efficiently select a combination of compressed logical pages from the buffer that desirably fit within the ECC codeword. Therefore, in some situations, additional measures may be implemented to ensure efficient use if ECC containers.

According to some embodiments, which are in no way intended to limit the invention, it may be desirable to implement tight packing, thereby resulting in straddling between ECC containers in certain instances. However, it may be desired to limit the straddling to instances which span between ECC containers positioned on the same physical page, e.g., as opposed to instances which span between ECC containers positioned on two different physical pages. As a result, storage capacity may be improved for instances in which the average compressed logical page length is higher than desired, e.g., the compressed logical pages are not substantially compressed. Thus, by selectively introducing straddling, the waste of undesirable amounts of ECC container capacity may be avoided.

Figure 8:
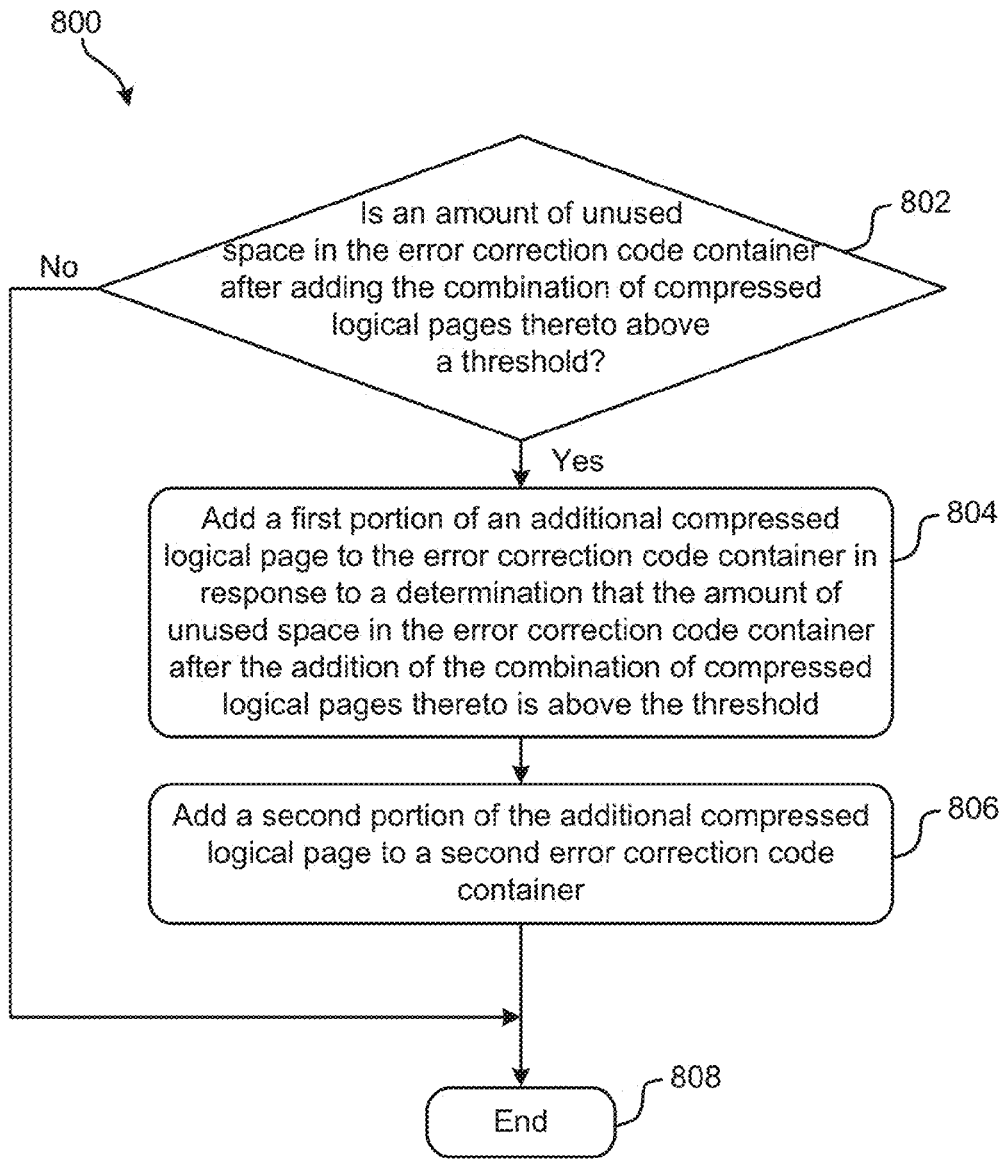
FIG. 8 is a flowchart of a process, in accordance with one embodiment.

By selectively implementing straddling between ECC containers in certain situations, some embodiments may be able to perform adaptive packing, whereby both tight packing (e.g., using straddling) and aligned packing may be implemented interchangeably. Specifically, FIG. 8 illustrates an optional method 800 for implementing an adaptive packing scheme, which may be implemented (e.g., performed) after operation 502 of method 500 above in order to determine whether straddling (tight packing) should be implemented, according to one embodiment which is in no way intended to limit the invention. It follows that method 800 may be performed in accordance with the present invention in any of the environments depicted in FIGS. 1-5B, among others, in various embodiments. More or less operations than those specifically described in FIG. 8 may be included in optional method 800, as would be understood by one of skill in the art upon reading the present descriptions.

Each of the steps of the optional method 800 may be performed by any suitable component of the operating environment. For example, in various embodiments, the optional method 800 may be partially or entirely performed by a controller, a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the optional method 800. Illustrative processors include, but are not limited to, a central processing unit (CPU), an application specific integrated circuit (ASIC), a field programmable gate array (FPGA), etc., combinations thereof, or any other suitable computing device known in the art.

As illustrated in FIG. 8, optional method 800 includes decision 802 in which a determination is made as to whether an amount of unused space in the ECC container is above a threshold after adding the combination of compressed logical pages (e.g., selected in operation 502) thereto. The threshold may weigh the benefits of preventing unused portions of ECC containers with respect to the benefits of preventing read amplification and/or latency. In other words, decision 802 determines whether the amount of unused space in a given ECC container is an acceptable amount. However, in some approaches decision 802 may equivalently determine whether to add a portion of an additional compressed logical page to the ECC container based on the amount of used space in an ECC container, e.g., with respect to a threshold. Depending on the desired approach, a threshold as used herein may be predetermined, calculated in real-time, stored in memory (e.g., a lookup table), selected by a user during an operation, etc.

If it is determined in decision 802 that the amount of unused space in the ECC container is below a threshold after adding the combination of compressed logical pages thereto, method 800 proceeds to operation 808 whereby method 800 ends.

Method 800 additionally includes adding a first portion of an additional compressed logical page to the ECC container in response to a determination that the amount of unused space in the ECC container after the addition of the combination of compressed logical pages thereto is above the threshold. See operation 804. Furthermore, operation 806 includes adding a second portion of the additional compressed logical page to a second ECC container. Thus, if it is determined that the amount of unused space in the ECC container is undesirably high, one or more additional compress logic pages are preferably added to the ECC container in a tight packing fashion, regardless of the straddling that may be required to do so. By selectively implementing straddling between ECC containers in certain situations, method 800 may be able effectively perform both tight packing (e.g., using straddling) and aligned packing interchangeably.

Proceeding operation 806, method 800 advances to operation 808 whereby method 800 is completed. However, as previously mentioned, method 800 is an optional sequence of steps which may be performed following operation 502 of method 500 in FIG. 5A according to some approaches. Thus, for embodiments implementing optional method 800 in addition to method 500, after optional method 800 has been fully performed, the execution of method 500 may resume at operation 504.

As mentioned above, the value of the threshold may be used to weigh the benefits of preventing unused portions of ECC containers with respect to the benefits of preventing read amplification and/or latency. For example, a lower threshold may be used in situations where the benefits of high capacity gains outweigh the read amplification and/or latency associated with straddling. Alternatively, a higher threshold may be used in situations where the read amplification and/or latency associated with straddling are unacceptable. It follows that the value of the threshold may be determined, e.g., by a user, depending on the desired embodiment by balancing the results of increased capacity and straddling. Moreover, a threshold value may be tuned during operation to account for changing conditions, incoming compressed logical pages, ECC container size, etc. The threshold implemented in an exemplary adaptive packing embodiment may even be 0, in which case the only aligned packing allowed would constitute a perfect fit without requiring straddling, thereby preventing the waste of any amount of the ECC container.

However, again it may be desired to limit the straddling to instances which span between ECC containers positioned on the same physical page, e.g., as opposed to instances which span between ECC containers positioned on two different physical pages. Thus, straddling between containers of the same page may be permitted, while straddling between containers on different pages is not. Yet, in some approaches it may be desirable to allow straddling between ECC containers on different physical pages as well. Some logical pages may not be compressible, e.g., if they are already compressed at a previous logical process, and therefore may not adequately fit within an ECC container. As a result, storage capacity may be improved for instances in which the average compressed logical page length is higher than desired, e.g., the compressed logical pages are not substantially compressed. Thus, by selectively introducing straddling, the loss of undesirable amounts of ECC container capacity may be avoided.

According to some approaches, the second ECC container to which the second portion of the additional compressed logical page is added may be empty. In other words, the second ECC container may not have any other logical pages added thereto, but rather may be used strictly as an overflow. However, according to other approaches, the second ECC container may include previously added (e.g., written) compressed logical pages. It follows that, as new logical pages are compressed and added to a buffer, compressed logical pages may be added to unused portions of previously filled ECC containers. This further reduces the amount of unused space in ECC containers by adding the straddling (overflowing) data to a nearly-full ECC container.

Straddling may be permitted in other situations as well. For example, in some cases the size of the compressed logical pages may determine whether straddling may be performed. When the length of compressed logical pages is too large to allow for tight packing, such as where two compressed logical pages would not fit in an ECC container and a single compressed logical page would fill an unacceptably small amount of the ECC container, alternate approaches may be implemented in an attempt to minimize capacity loss of ECC containers.

Figure 9:
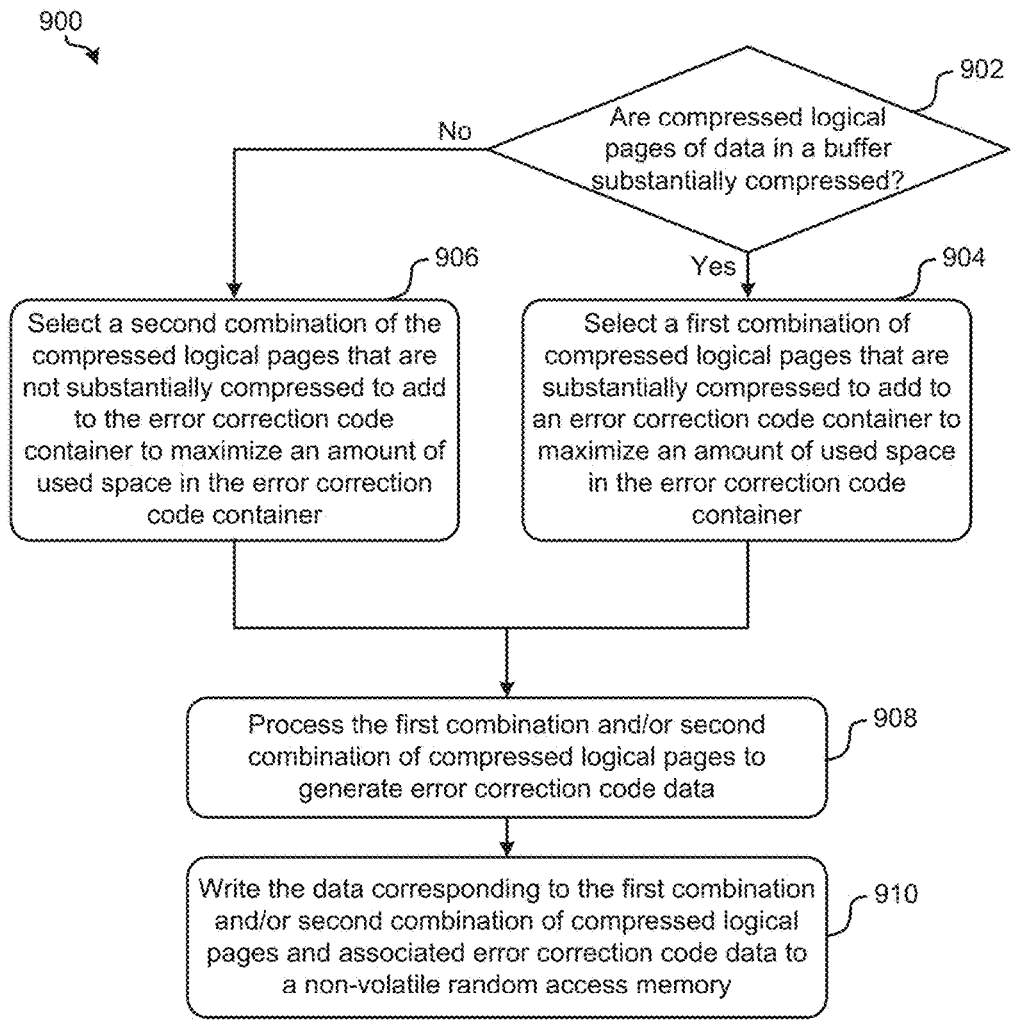
FIG. 9 is a flowchart of a process, in accordance with one embodiment.

Looking to FIG. 9, a flowchart of a method 900 for implementing an adaptive packing scheme is shown according to one embodiment. Moreover, the method 900 may be performed in accordance with the present invention in any of the environments depicted in FIGS. 1-5B, among others, in various embodiments. More or less operations than those specifically described in FIG. 9 may be included in method 900, as would be understood by one of skill in the art upon reading the present descriptions.

Each of the steps of the method 900 may be performed by any suitable component of the operating environment. For example, in various embodiments, the method 900 may be partially or entirely performed by a controller, a processor, etc., or some other device having one or more processors therein. The processor, e.g., processing circuit(s), chip(s), and/or module(s) implemented in hardware and/or software, and preferably having at least one hardware component may be utilized in any device to perform one or more steps of the method 900. Illustrative processors include, but are not limited to, a central processing unit (CPU), an application specific integrated circuit (ASIC), a field programmable gate array (FPGA), etc., combinations thereof, or any other suitable computing device known in the art.

As illustrated in FIG. 9, method 900 includes determining whether at least some of compressed logical pages of data in a buffer are substantially compressed, e.g., or equivalently not substantially uncompressed. See operation 902. Moreover, according to some approaches, operation 902 may also determine whether compressed logical pages of data in the buffer are not substantially compressed. Thus, depending on the application, operation 902 may be able to determine whether compressed logical pages in a buffer are substantially compressed and/or not substantially compressed.

Referring still to FIG. 9, in response to a determination that at least some of the compressed logical pages in the buffer are substantially compressed, method 900 may select a first combination of compressed logical pages that are substantially compressed to add to an ECC container to maximize an amount of used space in the ECC container. See operation 904. However, it should be noted that, although operation 904 is described as maximizing an amount of used space in an ECC container, method 900 may equivalently attempt to minimize an amount of unused space in the ECC container. It is also preferred that the first combination of substantially compressed logical pages fills only a portion of the ECC container.

Furthermore, in response to a determination that at least some of the compressed logical pages in the buffer are not substantially compressed, operation 906 includes selecting a second combination of the compressed logical pages that are not substantially compressed to add to the ECC container to maximize an amount of used space in the ECC container (or equivalently, to minimize an amount of unused space in the ECC container).

Although operations 904 and 906 are described above as being performed in response to contradicting determinations, according to some approaches, both operation 904 and operation 906 may be performed, e.g., when it is determined that some of the compressed logical pages in the buffer are substantially compressed, while other compressed logical pages in the buffer are not substantially compressed. Thus, depending on the embodiment, one or both of operations 904, 906 may be performed in method 900, e.g., depending on the determination made in operation 902.

Referring still to method 900, operation 908 includes processing the first combination and/or second combination of compressed logical pages to generate ECC data. Furthermore, operation 910 includes writing the data corresponding to the first combination and/or second combination of compressed logical pages and associated ECC data to a non-volatile random access memory.

As previously described, straddling may be performed to add compressed logical pages that are not substantially compressed to the ECC container. Thus, by selecting a combination of the compressed logical pages that are not substantially compressed to add to the ECC container in operation 906, straddling may be implemented to add a first portion of one of the compressed logical pages to a first ECC container, in addition to adding a second portion of the one of the compressed logical pages to a second ECC container (e.g., see operations 804, 806 of FIG. 8).

Once again, it may be desired to limit the straddling to instances which span between ECC containers positioned on the same physical page, e.g., as opposed to instances which span between ECC containers positioned on two different physical pages. Thus, straddling between containers of the same page may be permitted, while straddling between containers on different pages is not. However, in some approaches it may be desirable to allow straddling between ECC containers on different physical pages as well.

It follows that embodiments in which at least some of the compressed logical pages, a majority of the compressed logical pages, all of the compressed logical pages, etc. are not substantially compressed may implement straddling to allow for the protection of data corresponding to compressed logical pages which are not substantially compressed.

Depending on the desired embodiment, different methods may be implemented to select the compressed logical page (e.g., that is not substantially compressed) to be straddled between ECC containers. For example, in some embodiments, compressed logical pages may be selected at random to be straddled between ECC containers. In other words, no additional processing may be required to select a compressed logical page to fill an empty portion of an ECC container and straddle to another ECC container. However, in other embodiments it may be desirable to select the compressed logical page with the longest length to be straddled between two ECC containers. Further still, some embodiments may implement Equation 3 to select a compressed logical page that will straddle into the next ECC container as little as possible.

$$K' = \min_{w=K+1,\ldots,K+265} [w], \text{ such that: } m_L(w) - w = 0 \quad \text{Equation 3}$$

Again, Equation 3 represents a formulation of the problem of selecting a compressed logical page that will straddle into the next ECC container as little as possible in a mathematical sense. The variables used in Equation 3 may be defined as follows:

L represents the number of compressed logical pages kept in a buffer.

K represents the length of the ECC container measured using units of 128-bit words.

w represents a variable whose value spans from K+1 to K+265.

As will be appreciated by one skilled in the art upon reading the present description, function K' of Equation 3 determines the minimum value of w which satisfies the stipulation that $m_L(w)-w=0$. Once the value of K' has been computed it is possible to determine the selection of compressed logical pages from the buffer that run over into the next ECC codeword container as little as possible by performing trace-back from the recursion state $m_L(K')$.

As will be appreciated by one skilled in the art upon reading the present description, function K' of Equation 3 may be updated for all values of w following a forward recursion. According to an exemplary approach, the forward recursion procedure described above in FIG. 6A may be implemented to update function K'.

Moreover, a trace-back procedure may be used to determine the actual optimal binary vector corresponding to a selected compressed logical page to straddle between two given ECC containers. According to an exemplary approach, the trace-back procedure described above in FIG. 6B may be implemented to determine the actual optimal binary vector corresponding to a selected compressed logical page to straddle between two given ECC containers.

Figure 10:
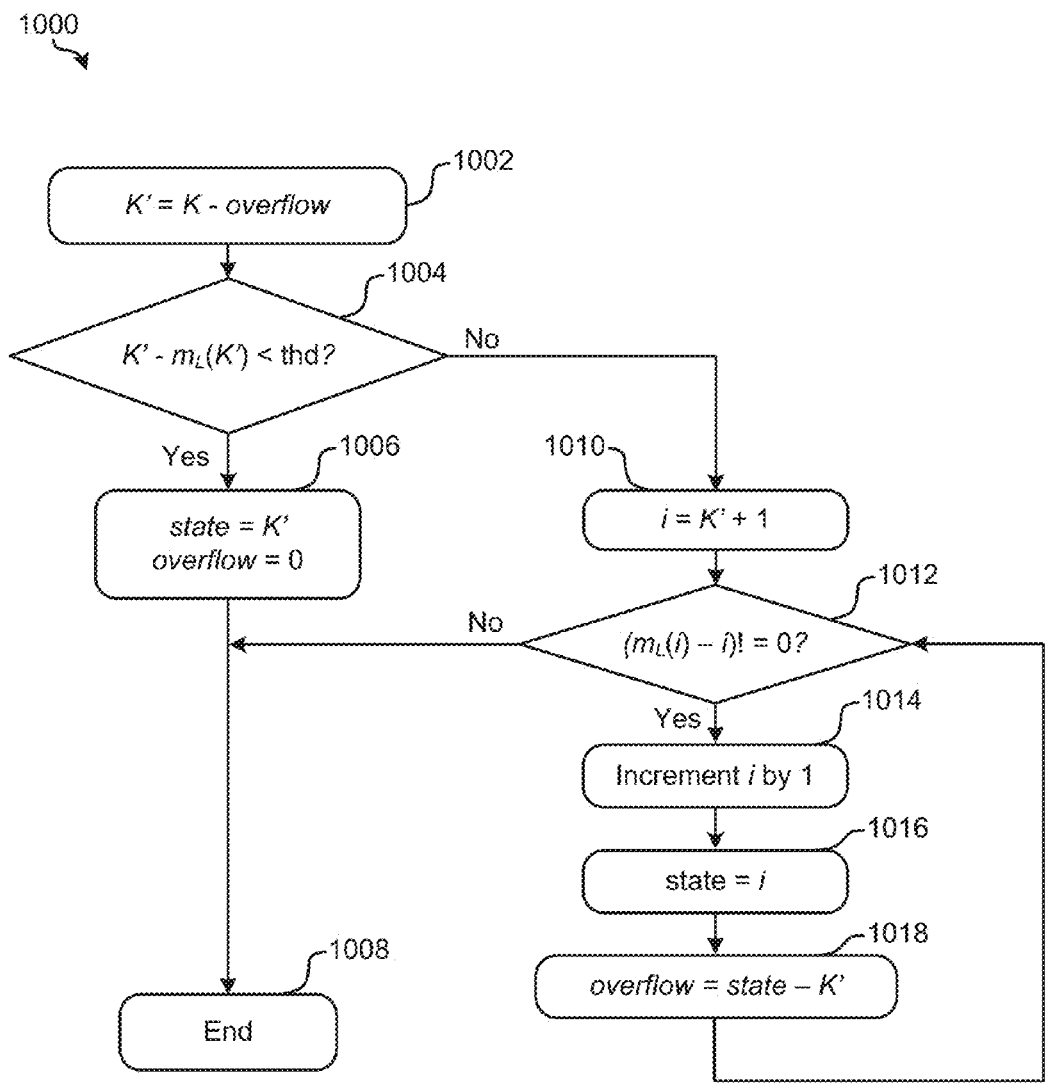
FIG. 10 is a flowchart of a process, in accordance with one embodiment.

As described above, the waste of undesirable amounts of ECC container capacity may be avoided by selectively introducing straddling. By selectively implementing straddling between ECC containers in certain situations, some embodiments may be able perform both tight packing (e.g., using straddling) and aligned packing interchangeably. FIG. 10 illustrates an exemplary implementation of a method 1000 with process steps which may be used to determine whether to implement aligned packing or tight packing for a given situation, according to one embodiment. Method 1000 calculates the value of K' according to Equation 3 recursively, taking into account any overflow into the current ECC container that may have occurred due to straddling on the previous ECC container. Moreover, the method 1000 illustrated in FIG. 10 may be performed in accordance with the present invention in any of the environments depicted in FIGS. 1-9, among others, in various embodiments. More or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, the method 1000 may be partially or entirely performed by controllers, processors, etc., or some other device having one or more processors therein. The processor, e.g., processing circuit(s), chip(s), and/or module(s) implemented in hardware and/or software, and preferably having at least one hardware component may be utilized in any device to perform one or more steps of the method 1000. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 10, method 1000 includes operation 1002, where the value of K' is set equal to the value of K−overflow. As described above, K represents the length of the ECC container measured using units of 128-bit words, while at the beginning of the method, overflow represents the amount of data that has been straddled onto the current ECC codeword. However, at the end of the method, overflow represents the amount of data that will be straddled onto the next ECC codeword. Thus, the difference calculated in operation 1002 determines the remaining space in a current ECC container.

Referring still to FIG. 10, decision 1004 determines whether the value of $K'-m_L(K')$ is less than thd, where thd is a predefined threshold corresponding to an amount of allowable wasted space in the ECC container. The determination made in decision 1004 decides whether tight packing or aligned packing should be implemented. Specifically, when decision 1004 determines the value of $K'-m_L(K')$ is less than thd, method 1000 determines that aligned packing should be implemented. Method 1000 then proceeds to operation 1006 where the value of state is set equal to the value of K', and overflow is set equal to 0. Method 1000 then proceeds to operation 1008 whereby method 1000 is ended.

Returning to decision 1004, when it is determined that the value of $K'-m_L(K')$ is greater than thd, method 1000 determines that tight packing should be implemented. Method 1000 then proceeds to operation 1010 where the value of i is set equal to the value of K'+1. Furthermore, decision 1012 includes determining whether the value of $(m_L(i)-i)!$ is equal to 0. When decision 1012 determines the value is not equal to 0, method 1000 proceeds to operation 1008 and method 1000 is ended. Alternatively, when decision 1012 determines the value is equal to 0, method 1000 proceeds to operation 1014 where the value of i is incremented by 1. Moreover, operation 1016 includes setting the value of state equal to the incremented value of i, and operation 1018 includes setting the value of overflow equal to the value of state−K'.

Figure 11A:
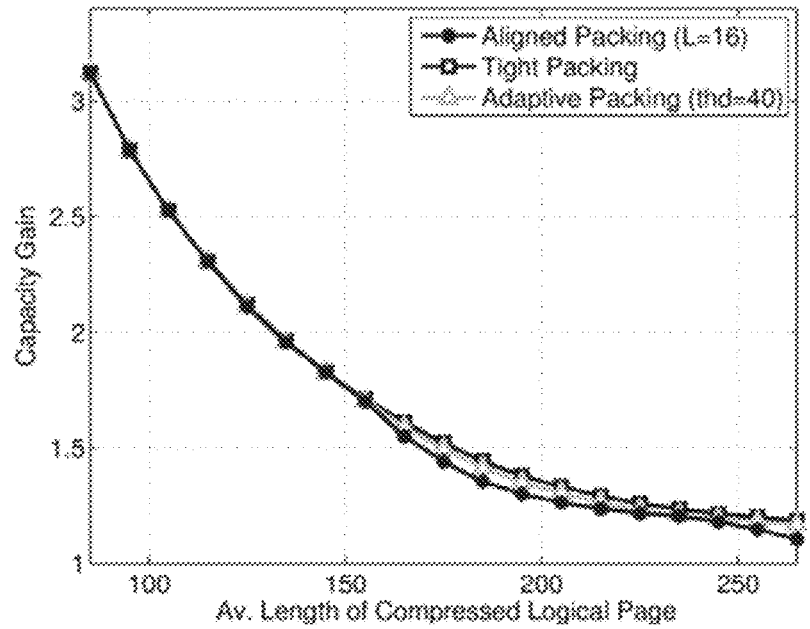
FIG. 11A is a graph of capacity gain with respect to the average length of compressed logical pages, in accordance with one embodiment.

FIG. 11A includes a graph 1100 which illustrates capacity gain with respect to the average length of a compressed logical page in a given buffer. As shown, capacity gains achieved using tight packing (which fills the whole ECC container), is virtually the same as the capacity gains achieved using aligned packing methods (having a buffer length of 16) and adaptive packing methods (having a threshold of 40) for lower average lengths of the compressed logical pages. As before, there is effectively no capacity loss experienced when the average length of the compressed logical pages is below 150 128-bit words.

However, again it becomes apparent that for larger average lengths of compressed logical pages different result is produced with respect to the performances of these three plotted schemes of graph 1100. Although the data associated with aligned packing for compressed logical pages having average lengths greater than about 150 128-bit words have produced a similar capacity loss to those seen in FIG. 7C above, the adaptive packing plot follows the capacity gains experienced by tight packing much more closely. It follows that embodiments implementing adaptive packing methods capable of implementing both tight packing and aligned packing while selectively straddling, result in minimal capacity loss across all workloads.

Figure 11B:
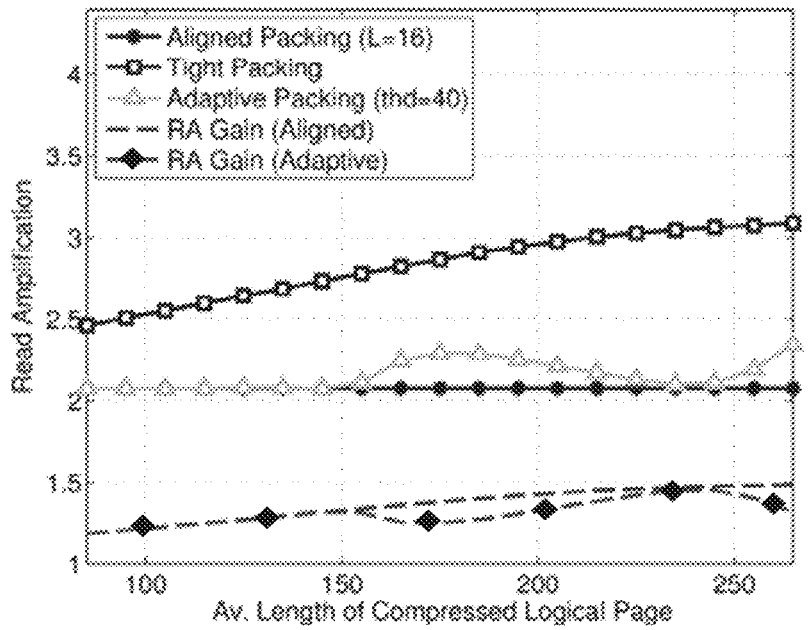
FIG. 11B is a graph of read amplification with respect to the average length of compressed logical pages, in accordance with one embodiment.

Furthermore, FIG. 11B includes a graph 1110 which illustrates the read amplification associated with different average lengths of compressed logical pages. Specifically, the graph 1110 illustrates the desired read amplification reduction achieved using aligned packing methods and adaptive packing methods as described in different embodiments herein.

As shown, aligned packing is able to achieve a constant read amplification of about 2.1 while tight packing results in much higher read amplification levels, particularly as the average length of compressed logical pages increases. Moreover, the adaptive packing scheme comes close to the minimal achievable read amplification of about 2.1, regardless of the average length of the compressed logical pages. The dashed lines indicate the difference in read amplification experienced by tight packing schemes and adaptive packing schemes with respect to the minimal read amplification of aligned packing.

Rather than filling only one ECC container at a time, some of the embodiments described herein may be capable of adding compressed logical pages to multiple ECC containers, e.g., simultaneously. According to an exemplary approach, 15 ECC containers may be filled in parallel from a common buffer. Thus, according to one approach, selecting compressed logical pages from a buffer (e.g., see operation 502 of FIG. 5A) may include concurrently selecting multiple combinations of compressed logical pages of data to maximize amounts of used space in multiple ECC containers. The ability to concurrently select multiple combinations of compressed logical pages of data allows for increased efficiency and faster data processing rates while ensuring efficient use of ECC container space without introducing undue read amplification and/or latency as experienced by conventional products.

Those skilled in the art, upon reading the present description, will be able to identify the problem of packing multiple ECC containers with compressed logical pages selected from buffer with the 'multiple knapsack problem'. This problem can be solved in a sub-optimal way by first selecting from the buffer a set of compressed logical pages that minimize the un-used space in a first ECC container. The selected compressed logical pages are then removed from the buffer and another set of compressed logical pages are selected from the buffer of reduced size that minimize the unused space in a second ECC container. In this way a single buffer can be used to pack multiple ECC containers.

According to an in-use embodiment, any one or more of the operations and/or determinations described above with reference to FIGS. 5A-6B, 8-10 may be performed by a computer program product comprising a computer readable storage medium having program instructions embodied therewith. Specifically, the program instructions may be readable and/or executable by a controller to cause the controller to perform the one or more of the operations and/or determinations, as would be appreciated by one skilled in the art upon reading the present description.

However, according to another in-use embodiment, any one or more of the operations and/or determinations described above with reference to FIGS. 5A-6B, 8-10 may be performed by a system which includes NVRAM configured to store data, in addition to a processor and logic integrated with and/or executable by the processor to perform the one or more of the operations and/or determinations, as would be appreciated by one skilled in the art upon reading the present description.

It follows that various embodiments described and/or suggested herein include workload-adaptive algorithms for efficiently packing compressed logical pages into ECC codewords. Algorithms for packing compressed logical pages (e.g., user logical pages) into ECC containers disclosed herein are able to achieve minimal read latency and minimal read amplification performance in addition to achieving improved storage capacity for a sufficiently compressible workload. Algorithms may use dynamic programming to determine efficient combinations of compressed logical pages of a buffer to pack data into the ECC codeword containers. As previously described, aligned packing may be implemented to achieve efficient ECC container packing for compressed logical pages that are significantly compressed, while adaptive packing schemes may be implemented when compressed logical pages are not all significantly compressed, thereby ensuring that capacity loss is minimized.

Thus, different embodiments described herein are able to implement aligned packing schemes and adaptive packing schemes as desired to achieve an efficient packing of compressed logical pages into one or more ECC codewords in a variety of different circumstances. Moreover, any of the approaches described herein may be implemented using dynamic programming. It follows that storage environments which include compressed logical pages of different lengths may implement some of the various approaches described herein in order to pack the compressed logical pages into ECC containers in a desirable way, thereby ensuring an efficient use of ECC containers, particularly compared to conventional approaches.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 12:
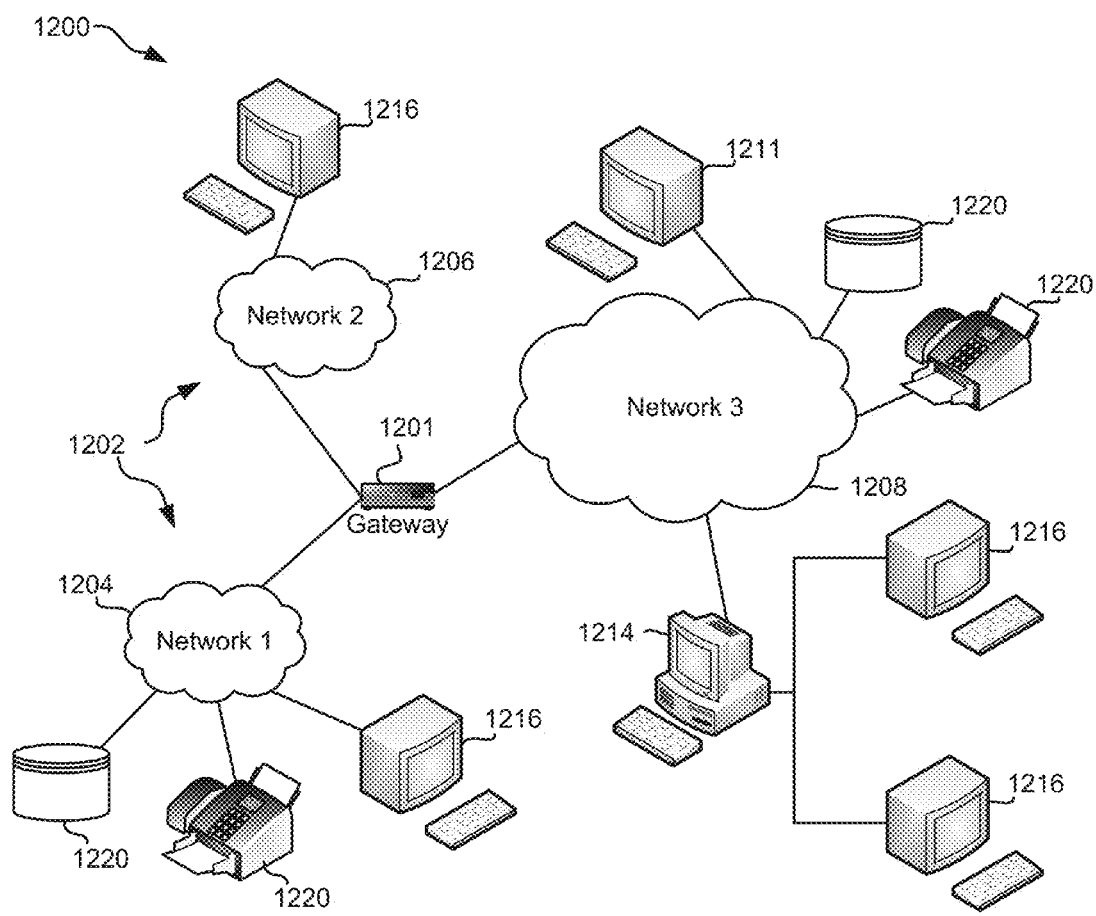
FIG. 12 is a network architecture, in accordance with one embodiment.

FIG. 12 illustrates a network architecture 1200, in accordance with one embodiment. As shown in FIG. 12, a plurality of remote networks 1202 are provided including a first remote network 1204 and a second remote network 1206. A gateway 1201 may be coupled between the remote networks 1202 and a proximate network 1208. In the context of the present network architecture 1200, the networks 1204, 1206 may each take any form including, but not limited to a LAN, a WAN such as the Internet, public switched telephone network (PSTN), internal telephone network, etc.

In use, the gateway 1201 serves as an entrance point from the remote networks 1202 to the proximate network 1208. As such, the gateway 1201 may function as a router, which is capable of directing a given packet of data that arrives at the gateway 1201, and a switch, which furnishes the actual path in and out of the gateway 1201 for a given packet.

Further included is at least one data server 1214 coupled to the proximate network 1208, and which is accessible from the remote networks 1202 via the gateway 1201. It should be noted that the data server(s) 1214 may include any type of computing device/groupware. Coupled to each data server 1214 is a plurality of user devices 1216. Such user devices 1216 may include a desktop computer, laptop computer, handheld computer, printer, and/or any other type of logic-containing device. It should be noted that a user device 1211 may also be directly coupled to any of the networks, in some embodiments.

A peripheral 1220 or series of peripherals 1220, e.g., facsimile machines, printers, scanners, hard disk drives, networked and/or local data storage units or systems, etc., may be coupled to one or more of the networks 1204, 1206, 1208. It should be noted that databases and/or additional components may be utilized with, or integrated into, any type of network element coupled to the networks 1204, 1206, 1208. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 1204, 1206, 1208, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

FIG. 13 shows a representative hardware environment associated with a user device 1216 and/or server 1214 of FIG. 12, in accordance with one embodiment. FIG. 13 illustrates a typical hardware configuration of a processor system 1300 having a central processing unit 1310, such as a microprocessor, and a number of other units interconnected via a system bus 1312, according to one embodiment. In some embodiments, central processing unit 1310 may include any of the approaches described above with reference to the one or more processors 210 of FIG. 2.

The processor system 1300 shown in FIG. 13 includes a Random Access Memory (RAM) 1314, Read Only Memory (ROM) 1316, and an I/O adapter 1318. According to some embodiments, which are in no way intended to limit the invention, I/O adapter 1318 may include any of the approaches described above with reference to I/O adapter 218 of FIG. 2. Referring still to processor system 1300 of FIG. 13, the aforementioned components 1314, 1316, 1318 may be used for connecting peripheral devices such as storage subsystem 1320 to the bus 1312. In some embodiments, storage subsystem 1320 may include a similar and/or the same configuration as data storage system 220 of FIG. 2. According to an example, which is in no way intended to limit the invention, storage subsystem 1320 may include non-volatile data storage cards, e.g., having NVRAM memory cards, RAM, ROM, and/or some other known type of non-volatile memory, in addition to RAID controllers as illustrated in FIG. 2.

With continued reference to FIG. 13, a user interface adapter 1322 for connecting a keyboard 1324, a mouse 1326, a speaker 1328, a microphone 1332, and/or other user interface devices such as a touch screen, a digital camera (not shown), etc., to the bus 1312.

Processor system 1300 further includes a communication adapter 1334 which connects the processor system 1300 to a communication network 1335 (e.g., a data processing network) and a display adapter 1336 which connects the bus 1312 to a display device 1338.

The processor system 1300 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 14:
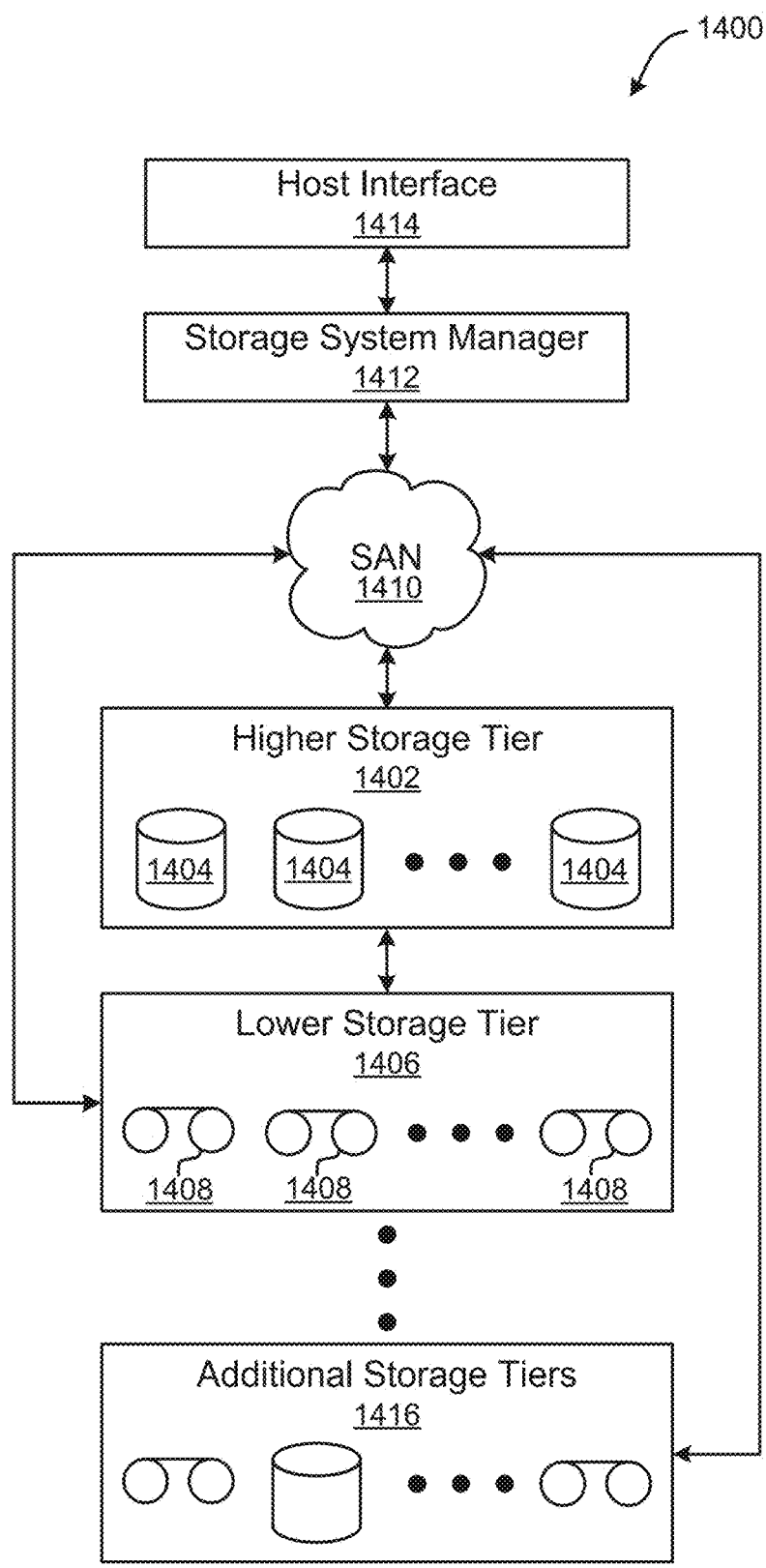
FIG. 14 is a tiered data storage system in accordance with one embodiment.

Moreover, FIG. 14 illustrates a storage system 1400 which implements high level (e.g., SSD) storage tiers in combination with lower level (e.g., magnetic tape) storage tiers, according to one embodiment. Note that some of the elements shown in FIG. 14 may be implemented as hardware and/or software, according to various embodiments. The storage system 1400 may include a storage system manager 1412 for communicating with a plurality of media on at least one higher storage tier 1402 and at least one lower storage tier 1406. However, in other approaches, a storage system manager 1412 may communicate with a plurality of media on at least one higher storage tier 1402, but no lower storage tier. The higher storage tier(s) 1402 preferably may include one or more random access and/or direct access media 1404, such as hard disks, nonvolatile memory (NVM), NVRAM), solid state memory in SSDs, flash memory, SSD arrays, flash memory arrays, etc., and/or others noted herein or known in the art. According to illustrative examples, FIGS. 3-4 show exemplary architectures of SSD systems which may be used as a higher storage tier 1402 depending on the desired embodiment.

Referring still to FIG. 14, the lower storage tier(s) 1406 preferably includes one or more lower performing storage media 1408, including sequential access media such as magnetic tape in tape drives and/or optical media, slower accessing HDDs, slower accessing SSDs, etc., and/or others noted herein or known in the art. One or more additional storage tiers 1416 may include any combination of storage memory media as desired by a designer of the system 1400. Thus the one or more additional storage tiers 1416 may, in some approaches, include a SSD system architecture similar or the same as those illustrated in FIGS. 1-2. Also, any of the higher storage tiers 1402 and/or the lower storage tiers 1406 may include any combination of storage devices and/or storage media.

The storage system manager 1412 may communicate with the storage media 1404, 1408 on the higher storage tier(s) 1402 and lower storage tier(s) 1406 through a network 1410, such as a storage area network (SAN), as shown in FIG. 14, or some other suitable network type. The storage system manager 1412 may also communicate with one or more host systems (not shown) through a host interface 1414, which may or may not be a part of the storage system manager 1412. The storage system manager 1412 and/or any other component of the storage system 1400 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1400 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1402, may include a majority of SSD storage media for storing data in a higher performing storage environment, and remaining storage tiers, including lower storage tier 1406 and additional storage tiers 1416 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1402, while data not having one of these attributes may be stored to the additional storage tiers 1416, including lower storage tier 1406. Of course, one of skill in the art, upon reading the present descriptions, may devise many other combinations of storage media types to implement into different storage schemes, according to the embodiments presented herein.

According to some embodiments, the storage system (such as 1400) may include logic configured to receive a request to open a data set, logic configured to determine if the requested data set is stored to a lower storage tier 1406 of a tiered data storage system 1400 in multiple associated portions, logic configured to move each associated portion of the requested data set to a higher storage tier 1402 of the tiered data storage system 1400, and logic configured to assemble the requested data set on the higher storage tier 1402 of the tiered data storage system 1400 from the associated portions.

Of course, this logic may be implemented as a method on any device and/or system or as a computer program product, according to various embodiments.

What is claimed is:

1. A computer-implemented method, comprising:
    selecting, from a buffer, a combination of compressed logical pages of data to maximize an amount of used space in an error correction code container;
    determining whether to add a first portion of an additional compressed logical page to the error correction code container, and a second portion of the additional compressed logical page to a second error correction code container, based on the amount of used space in the error correction code container;
    processing, using a hardware processer, the combination of compressed logical pages to generate error correction code data; and
    writing the data corresponding to the combination of compressed logical pages and the associated error correction code data to a non-volatile random access memory,
    wherein selecting the combination of compressed logical pages of data from the buffer includes using the following equation:

$$m_i(w) = \max\left[\sum_{j=1}^{i} x_j l_j\right] \text{ such that } \sum_{j=1}^{i} x_j l_j \leq w,$$

where i represents a variable whose value spans from 1 to L,
L represents a number of compressed logical pages kept in a buffer,
w represents a variable whose value spans from 0 to K,
K represents a length of the error correction code container,
$l_j$ represents a length of a compressed logical page at position "j" in the buffer, and
x is a binary vector for which the j-th element ($x_j$) is defined as being equal to 1 if the compressed logical page at position "j" in the buffer is added into the error correction code container, and 0 otherwise.

2. The method of claim 1, wherein all compressed logical pages in the buffer are considered during the selecting.

3. The method of claim 1, wherein the selecting includes concurrently selecting multiple combinations of compressed logical pages of data to maximize amounts of used space in multiple error correction code containers.

4. The method of claim 1, wherein the error correction code container is positioned on a first physical page and the second error correction code container is positioned on a second physical page.

5. The method of claim 1, wherein the determining includes determining whether an amount of unused space in the error correction code container after adding the combination of compressed logical pages thereto is above a threshold,
    wherein the method further comprises adding the first portion of the additional compressed logical page to the error correction code container in response to a determination that the amount of unused space in the error correction code container after the addition of the combination of compressed logical pages thereto is above the threshold,
    wherein the method further comprises adding the second portion of the additional compressed logical page to the second error correction code container in response to the determination that the amount of unused space in the error correction code container after the addition of the combination of compressed logical pages thereto is above the threshold,
    wherein the second error correction code container has previously written compressed logical pages therein.

6. The method of claim 1, wherein the determining includes determining that at least some of the compressed logical pages in the buffer are not substantially compressed,
    wherein the method further comprises selecting one of the compressed logical pages that is not substantially compressed in response to determining that at least some of the compressed logical pages in the buffer are not substantially compressed, wherein the method further comprises adding a first portion of the selected one of the compressed logical pages that is not substantially compressed to the error correction code container, wherein the method further comprises adding a second portion of the selected one of the compressed logical pages that is not substantially compressed to the second error correction code container.

7. The method of claim 1, wherein the combination of compressed logical pages is processed using an ECC encoder to generate the error correction code data.

8. A computer-implemented method, comprising:

selecting, from a buffer, a combination of compressed logical pages of data to maximize an amount of used space in an error correction code container;

determining whether to add a portion of an additional compressed logical page to the error correction code container based on the amount of used space in an error correction code container;

adding the portion of the additional compressed logical page to the error correction code container in response to the determining;

adding a second portion of the additional compressed logical page to a second error correction code container;

processing, using a hardware processer, the combination of compressed logical pages to generate error correction code data; and writing the data corresponding to the combination of compressed logical pages and the associated error correction code data to a non-volatile random access memory, wherein selecting the combination of compressed logical pages of data from the buffer includes using the following equation:

$$m_i(w) = \max\left[\sum_{j=1}^{i} x_j l_j\right] \text{ such that } \sum_{j=1}^{i} x_j l_j \leq w,$$

where i represents a variable whose value spans from 1 to L,

L represents a number of compressed logical pages kept in a buffer, w represents a variable whose value spans from 0 to K, K represents a length of the error correction code container, $l_j$ represents a length of a compressed logical page at position "j" in the buffer, and x is a binary vector for which the j-th element ($x_j$) is defined as being equal to 1 if the compressed logical page at position "j" in the buffer is added into the error correction code container, and 0 otherwise.

9. A computer program product comprising a computer readable storage medium having program instructions embodied therewith, the program instructions readable and/or executable by a controller to cause the controller to:

select, by the controller, a combination of compressed logical pages of data from a buffer to maximize an amount of used space in an error correction code container;

determine, by the controller, whether to add a first portion of an additional compressed logical page to the error correction code container, and a second portion of the additional compressed logical page to a second error correction code container, based on the amount of used space in the error correction code container;

process, by the controller, the combination of compressed logical pages to generate error correction code data; and write, by the controller, the data corresponding to the combination of compressed logical pages and the associated error correction code data to a non-volatile random access memory, wherein selecting the combination of compressed logical pages of data from the buffer includes using the following equation:

$$m_i(w) = \max\left[\sum_{j=1}^{i} x_j l_j\right] \text{ such that } \sum_{j=1}^{i} x_j l_j \leq w,$$

where i represents a variable whose value spans from 1 to L,

L represents a number of compressed logical pages kept in a buffer, w represents a variable whose value spans from 0 to K, K represents a length of the error correction code container, $l_j$ represents a length of a compressed logical page at position "j" in the buffer, and x is a binary vector for which the j-th element ($x_j$) is defined as being equal to 1 if the compressed logical page at position "j" in the buffer is added into the error correction code container, and 0 otherwise.

10. The computer program product of claim 9, wherein all compressed logical pages in the buffer are considered during the selecting.

11. The computer program product of claim 9, wherein the selecting includes concurrently selecting multiple combinations of compressed logical pages of data to maximize amounts of used space in multiple error correction code containers.

12. The computer program product of claim 9, wherein the error correction code container is positioned on a first physical page and the second error correction code container is positioned on a second physical page.

13. The computer program product of claim 9, the program instructions are readable and/or executable by a controller to cause the controller to:

add the first portion of the additional compressed logical page to the error correction code container in response to the determining; and add the second portion of the additional compressed logical page to the second error correction code container, wherein the first and second error correction code containers are positioned on the same physical page.

14. The computer program product of claim 9, wherein the determining includes determining whether an amount of unused space in the error correction code container after adding the combination of compressed logical pages thereto is above a threshold, wherein the program instructions are readable and/or executable by the controller to cause the controller to add the first portion of the additional compressed logical page to the error correction code container in response to a determination that the amount of unused space in the error correction code container after the addition of the combination of compressed logical pages thereto is above the threshold, wherein the program instructions are readable and/or executable by the controller to cause the controller to add the second portion of the additional compressed logical page to the second error correction code container in response to the determination that the amount of unused space in the error correction code container after the addition of the combination of compressed logical pages thereto is above the threshold, wherein the second error correction code container has previously written compressed logical pages therein.

15. The computer program product of claim 9, wherein the determining includes determining whether at least some of the compressed logical pages in the buffer are not substantially compressed, wherein the program instructions are readable and/or executable by the controller to cause the controller to select one of the compressed logical pages that is not substantially compressed in response to determining that at least some of the compressed logical pages in the buffer are not substantially compressed, wherein the program instructions are readable and/or executable by the controller to cause the controller to add a first portion of the selected one of the compressed logical pages that is not substantially compressed to the error correction code container, wherein the program instructions are readable and/or executable by the controller to cause the controller to add a second portion of the selected one of the compressed logical pages that is not substantially compressed to the second error correction code container.

16. A system, comprising:
non-volatile random access memory (NVRAM) configured to store data; and
a processor and logic integrated with and/or executable by the processor, the logic being configured to:
select a combination of compressed logical pages of data from a buffer to maximize an amount of used space in an error correction code container;
determine whether to add a first portion of an additional compressed logical page to the error correction code container, and a second portion of the additional compressed logical page to a second error correction code container, based on the amount of used space in the error correction code container;
process the combination of compressed logical pages to generate error correction code data; and
write the data corresponding to the combination of compressed logical pages and the associated error correction code data to a non-volatile random access memory,
wherein selecting the combination of compressed logical pages of data from the buffer includes using the following equation:

$$m_i(w) = \max\left[\sum_{j=1}^{i} x_j l_j\right] \text{ such that } \sum_{j=1}^{i} x_j l_j \leq w,$$

where i represents a variable whose value spans from 1 to L,
L represents a number of compressed logical pages in a buffer,
w represents a variable whose value spans from 0 to K,
K represents a length of the error correction code container,
$l_j$ represents a length of a compressed logical page at position "j" in the buffer, and
x is a binary vector for which the j-th element ($x_j$) is defined as being equal to 1 if the compressed logical page at position "j" in the buffer is added into the error correction code container, and 0 otherwise.

17. The system of claim 16, wherein all compressed logical pages in the buffer are considered during the selecting.

18. The system of claim 16, wherein the selecting includes concurrently selecting multiple combinations of compressed logical pages of data to maximize amounts of used space in multiple error correction code containers.

19. The system of claim 16, wherein the error correction code container is positioned on a first physical page and the second error correction code container is positioned on a second physical page.

20. The system of claim 16, wherein the logic is configured to:
add the first portion of the additional compressed logical page to the error correction code container in response to the determining; and
add the second portion of the additional compressed logical page to the second error correction code container,
wherein the first and second error correction code containers are positioned on the same physical page.

21. The system of claim 16, wherein the determining includes determining whether an amount of unused space in the error correction code container after adding the combination of compressed logical pages thereto is above a threshold,
wherein the logic is configured to add the first portion of the additional compressed logical page to the error correction code container in response to a determination that the amount of unused space in the error correction code container after the addition of the combination of compressed logical pages thereto is above the threshold,
wherein the logic is configured to add the second portion of the additional compressed logical page to the second error correction code container in response to the determination that the amount of unused space in the error correction code container after the addition of the combination of compressed logical pages thereto is above the threshold,
wherein the second error correction code container has previously written compressed logical pages therein.

22. The system of claim 16, wherein the determining includes determining whether at least some of the compressed logical pages in the buffer are not substantially compressed,
wherein the logic is configured to select one of the compressed logical pages that is not substantially compressed in response to determining that at least some of the compressed logical pages in the buffer are not substantially compressed,
wherein the logic is configured to add a first portion of the selected one of the compressed logical pages that is not substantially compressed to the error correction code container,
wherein the logic is configured to add a second portion of the selected one of the compressed logical pages that is not substantially compressed to the second error correction code container.

23. A computer-implemented method, comprising:
- determining whether compressed logical pages of data in a buffer are substantially compressed;
- selecting a first combination of compressed logical pages that are substantially compressed to add to an error correction code container to maximize an amount of used space in the error correction code container;
- selecting a second combination of the compressed logical pages that are not substantially compressed to add to the error correction code container to maximize an amount of used space in the error correction code container;
- determining whether to add a first portion of one of the compressed logical pages in the second combination to the error correction code container, and a second portion of the one of the compressed logical pages in the second combination to a second error correction code container, based on the amount of used space in the error correction code container;
- processing, using a hardware processer, the first combination and/or second combination of compressed logical pages to generate error correction code data;
- writing the data corresponding to the first combination and/or second combination of compressed logical pages and associated error correction code data to a non-volatile random access memory;
- adding the first portion of the one of the compressed logical pages in the second combination to the error correction code container; and
- adding the second portion of the one of the compressed logical pages in the second combination to the second error correction code container,
- wherein the determination is made based on whether the amount of used space in the error correction code container is above a threshold,
- wherein the error correction code container and the second error correction code container are positioned on the same physical page,
- wherein all compressed logical pages in the buffer are considered during the selecting,
- wherein compressed logical pages having a compressed length which is less than 95% of their uncompressed length are determined to be substantially compressed.

* * * * *